US011004931B2

(12) United States Patent
Nitta et al.

(10) Patent No.: US 11,004,931 B2
(45) Date of Patent: May 11, 2021

(54) SEMICONDUCTOR DEVICE

(71) Applicant: Kabushiki Kaisha Toshiba, Tokyo (JP)

(72) Inventors: Shunsuke Nitta, Hakusan (JP); Takeru Matsuoka, Nomi Ishikawa (JP); Shunsuke Katoh, Komatsu Ishikawa (JP); Masatoshi Arai, Hakusan Ishikawa (JP); Shinya Ozawa, Kanazawa Ishikawa (JP); Bungo Tanaka, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/690,641

(22) Filed: Aug. 30, 2017

(65) Prior Publication Data

US 2018/0240867 A1     Aug. 23, 2018

(30) Foreign Application Priority Data

Feb. 21, 2017   (JP) .............................. JP2017-030339

(51) Int. Cl.
| | |
|---|---|
| *H01L 29/06* | (2006.01) |
| *H01L 29/40* | (2006.01) |
| *H01L 29/78* | (2006.01) |
| *H01L 23/528* | (2006.01) |
| *H01L 23/532* | (2006.01) |
| *H01L 29/423* | (2006.01) |

(52) U.S. Cl.
CPC ........ *H01L 29/0623* (2013.01); *H01L 23/528* (2013.01); *H01L 23/53261* (2013.01); *H01L 29/0615* (2013.01); *H01L 29/0696* (2013.01); *H01L 29/402* (2013.01); *H01L 29/407* (2013.01); *H01L 29/42368* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 7,679,136 B2 | 3/2010 | Kachi et al. | |
| 8,212,313 B2 | 7/2012 | Hanaoka | |

(Continued)

FOREIGN PATENT DOCUMENTS

| | | |
|---|---|---|
| CN | 105990426 A | 10/2016 |
| JP | 2001-358338 A | 12/2001 |

(Continued)

OTHER PUBLICATIONS

Non-Final Rejection of U.S. Appl. No. 14/639,362, filed Jun. 2, 2016.*

*Primary Examiner* — Telly D Green
(74) *Attorney, Agent, or Firm* — White & Case LLP

(57) ABSTRACT

According to an embodiment, a semiconductor device includes a semiconductor layer, a first electrode, and a first insulating film. The first electrode extends in a first direction and is provided inside the semiconductor layer. The first insulating film is provided between the semiconductor layer and the first electrode, a thickness of the first insulating film in a direction from the first electrode toward the semiconductor layer increasing in stages along the first direction. The first insulating film has three or more mutually-different thicknesses.

11 Claims, 30 Drawing Sheets

(56) References Cited

U.S. PATENT DOCUMENTS

| | | | |
|---|---|---|---|
| 9,029,215 B2 * | 5/2015 | Hossain | H01L 29/66348 438/259 |
| 9,048,214 B2 * | 6/2015 | Padmanabhan | H01L 29/404 |
| 9,196,720 B2 | 11/2015 | Tokuda | |
| 9,716,009 B2 * | 7/2017 | Kobayashi | H01L 21/28008 |
| 10,128,236 B2 * | 11/2018 | Jeong | H01L 27/0886 |
| 2013/0302958 A1 * | 11/2013 | Hossain | H01L 29/66348 438/270 |
| 2013/0306982 A1 | 11/2013 | Kudou | |
| 2014/0054682 A1 * | 2/2014 | Padmanabhan | H01L 29/404 257/330 |
| 2014/0167145 A1 * | 6/2014 | Ichinoseki | H01L 29/407 257/329 |
| 2016/0079375 A1 * | 3/2016 | Yamazaki | H01L 29/407 257/330 |
| 2016/0093719 A1 * | 3/2016 | Kobayashi | H01L 21/28008 257/330 |
| 2016/0181408 A1 | 6/2016 | Aichinger et al. | |
| 2016/0284699 A1 * | 9/2016 | Jeong | H01L 27/0886 |

FOREIGN PATENT DOCUMENTS

| | | | |
|---|---|---|---|
| JP | 2006-202931 A | 8/2006 | |
| JP | 2013-26488 A | 2/2013 | |
| JP | 5315638 B2 | 10/2013 | |
| JP | 2014-150148 A | 8/2014 | |
| JP | 2016-76729 A | 5/2016 | |
| JP | 2016-129226 A | 7/2016 | |
| WO | 2012-127821 A1 | 9/2012 | |

\* cited by examiner

SEMICONDUCTOR DEVICE

CROSS-REFERENCE TO RELATED APPLICATIONS

This application is based upon and claims the benefit of priority from Japanese Patent Application No. 2017-030339, filed on Feb. 21, 2017; the entire contents of which are incorporated herein by reference.

FIELD

Embodiments of the invention relate generally to a semiconductor device.

BACKGROUND

A MOSFET (Metal Oxide Semiconductor Field Effect Transistor) is a semiconductor device used in applications such as power control, etc. Such a MOSFET may have a trench gate structure, includes an element region in which semiconductor elements are provided, and includes a terminal region surrounding the element region. Trenches are formed through the terminal region from the element region; and a conductive body and/or an insulating film is filled into the interior of the trenches. It is a challenge to increase the breakdown voltage of the insulating film in the terminal region in the MOSFET having the trench gate structure.

DETAILED DESCRIPTION

Figure 1:
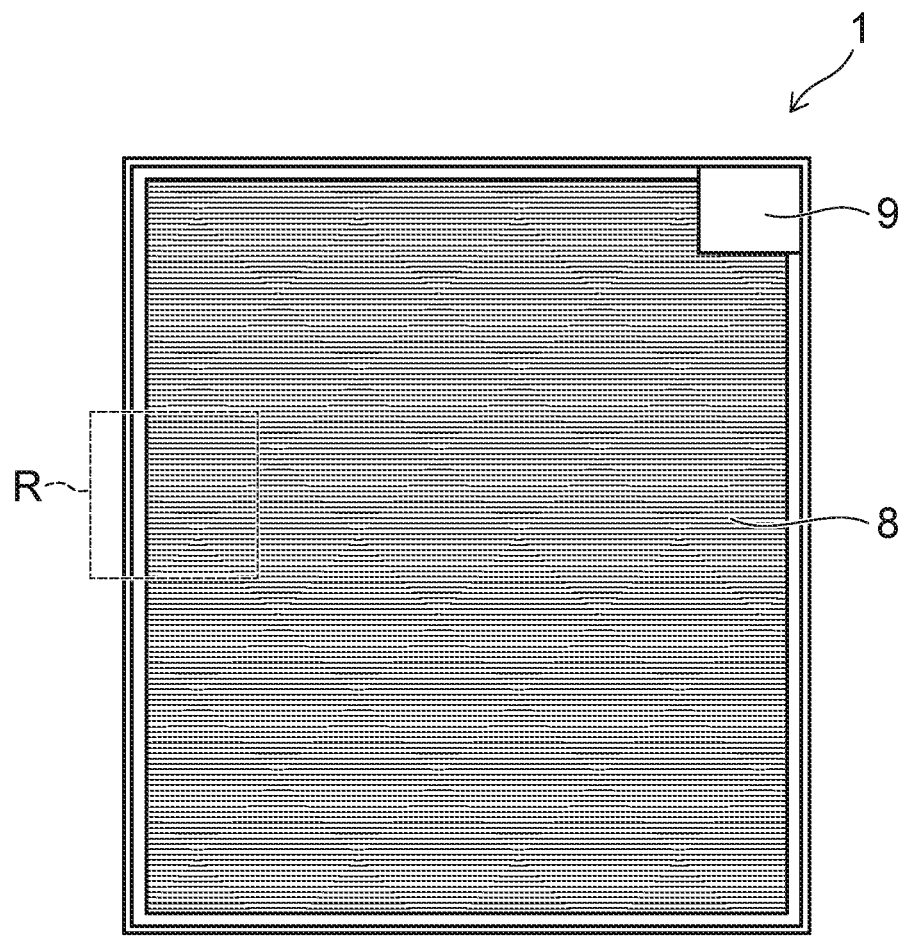
FIG. 1 is a plan view showing a semiconductor device according to a first embodiment.
Figure 1:
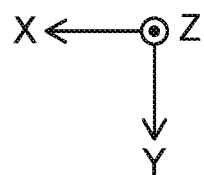

According to an embodiment, a semiconductor device includes a semiconductor layer, a first electrode, and a first insulating film. The first electrode extends in a first direction and is provided inside the semiconductor layer. The first insulating film is provided between the semiconductor layer and the first electrode, a thickness of the first insulating film in a direction from the first electrode toward the semiconductor layer increasing in stages along the first direction. The first insulating film has three or more mutually-different thicknesses.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

Hereinafter, in the specification, an XYZ orthogonal coordinate system is employed. Two directions parallel to an upper surface 10a of the substrate 10 and orthogonal to each other are defined as an "X-direction" and a "Y-direction", and a direction orthogonal to both the X-direction and the Y-direction is defined as a "Z-direction".

First Embodiment

Figure 2:
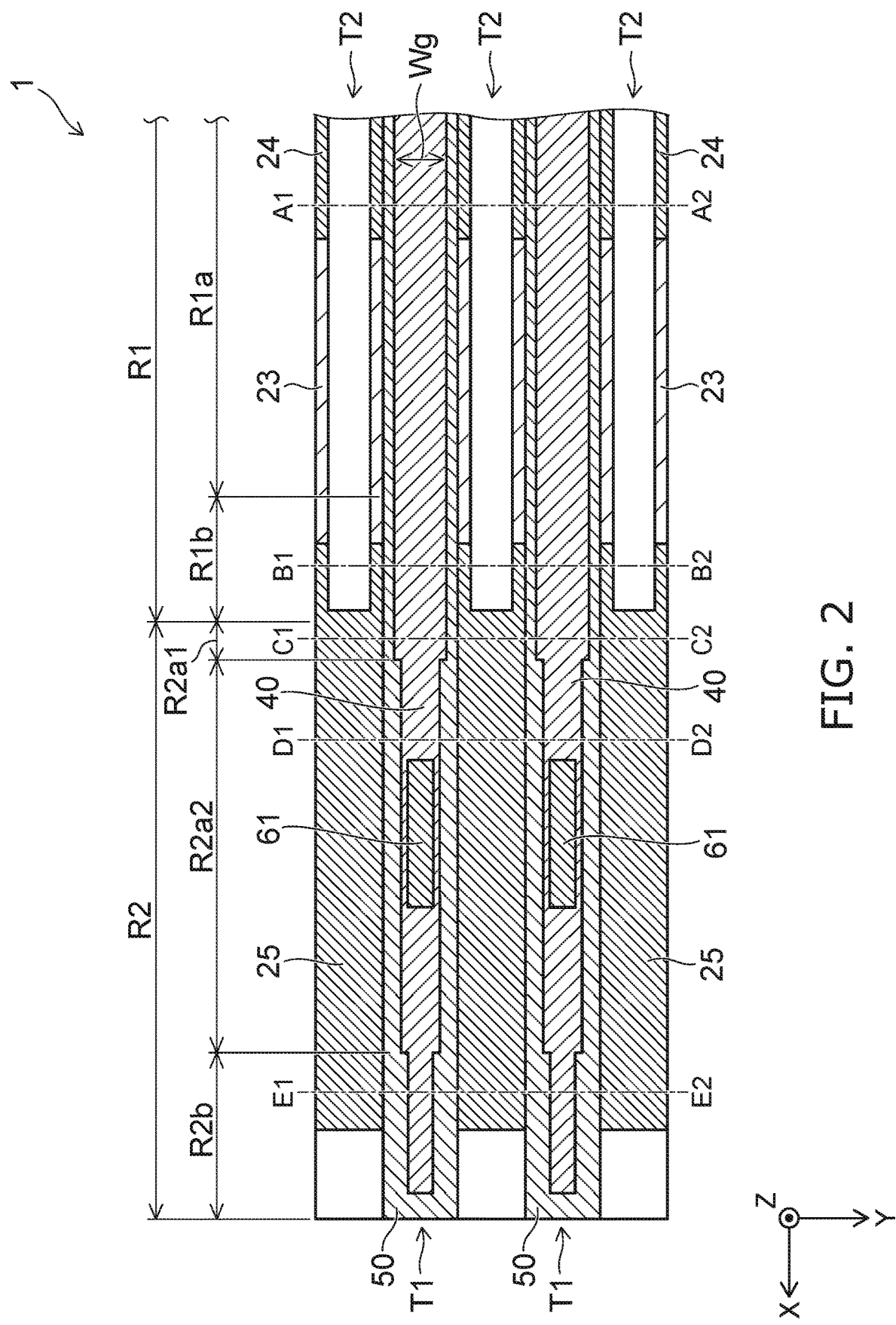
FIG. 2 is an enlarged view of region R of FIG. 1.

FIG. 1 is a plan view showing a semiconductor device according to the embodiment. FIG. 2 is an enlarged view of region R of FIG. 1. FIG. 3, FIG. 4, FIG. 5, FIG. 6, and FIG. 7 are cross-sectional views along line A1-A2, line B1-B2, line C1-C2, and lines D1-D2 and E1-E2 of FIG. 2.

As shown in FIG. 1, an element portion 8 and a pad 9 are provided in the semiconductor device 1. The element portion 8 is electrically connected to the pad 9 via an interconnect.

A semiconductor layer 20, a gate electrode 40, an insulating film 50, a source electrode 70, and a drain electrode 80 described below are provided in the element portion 8; and a cell pattern is formed. The pad 9 is, for example, a gate pad and is connected to the gate electrode 40 via a draw-out interconnect. The upper surface of the element portion 8 is used as the source electrode 70; the lower surface of the element portion 8 is used as the drain electrode 80; and each are connected to an external circuit.

As shown in FIG. 3 to FIG. 7, a substrate 10 is provided in the semiconductor device 1. The substrate 10 is, for example, a semiconductor substrate such as a silicon substrate, etc. For example, the conductivity type of the substrate 10 is an $n^+$-type.

The "$n^+$-type" is the n-type in which the effective impurity concentration is higher than the "$n^-$-type." This is similar for the "$p^+$-type" and the "$p^-$-type" as well. The "effective impurity concentration" refers to the concentration of the impurities contributing to the conductivity of the semiconductor material, and refers to the concentration excluding the cancelled portion in the case where both an impurity that forms donors and an impurity that forms acceptors are included. The n-type impurity is, for example, phosphorus (P); and the p-type impurity is, for example, boron (B).

An element region R1 and a terminal region R2 are provided in the semiconductor device 1. The element region R1 is provided in the center of the element portion 8. The terminal region R2 is provided in the end portion of the element portion 8. For example, the terminal region R2 is provided to surround the periphery of the element region R1. For example, in FIG. 1, the configurations of the terminal region R2 positioned at the two ends in an X-direction are the same; and the configurations of the terminal region R2 positioned at the two ends in a Y-direction are the same. The configurations of the terminal region R2 positioned at the two ends in the X-direction are different from the configurations of the terminal region R2 positioned at the two ends in the Y-direction.

First, the element region R1 will be described.

As shown in FIG. 2, the element region R1 includes a region R1a and a region R1b. The region R1a and the region R1b are arranged in order in a direction from the center of the element portion 8 toward the end portion of the element portion 8. That is, the region R1a and the region R1b are arranged along the X-direction to be adjacent to each other.

Figure 3:
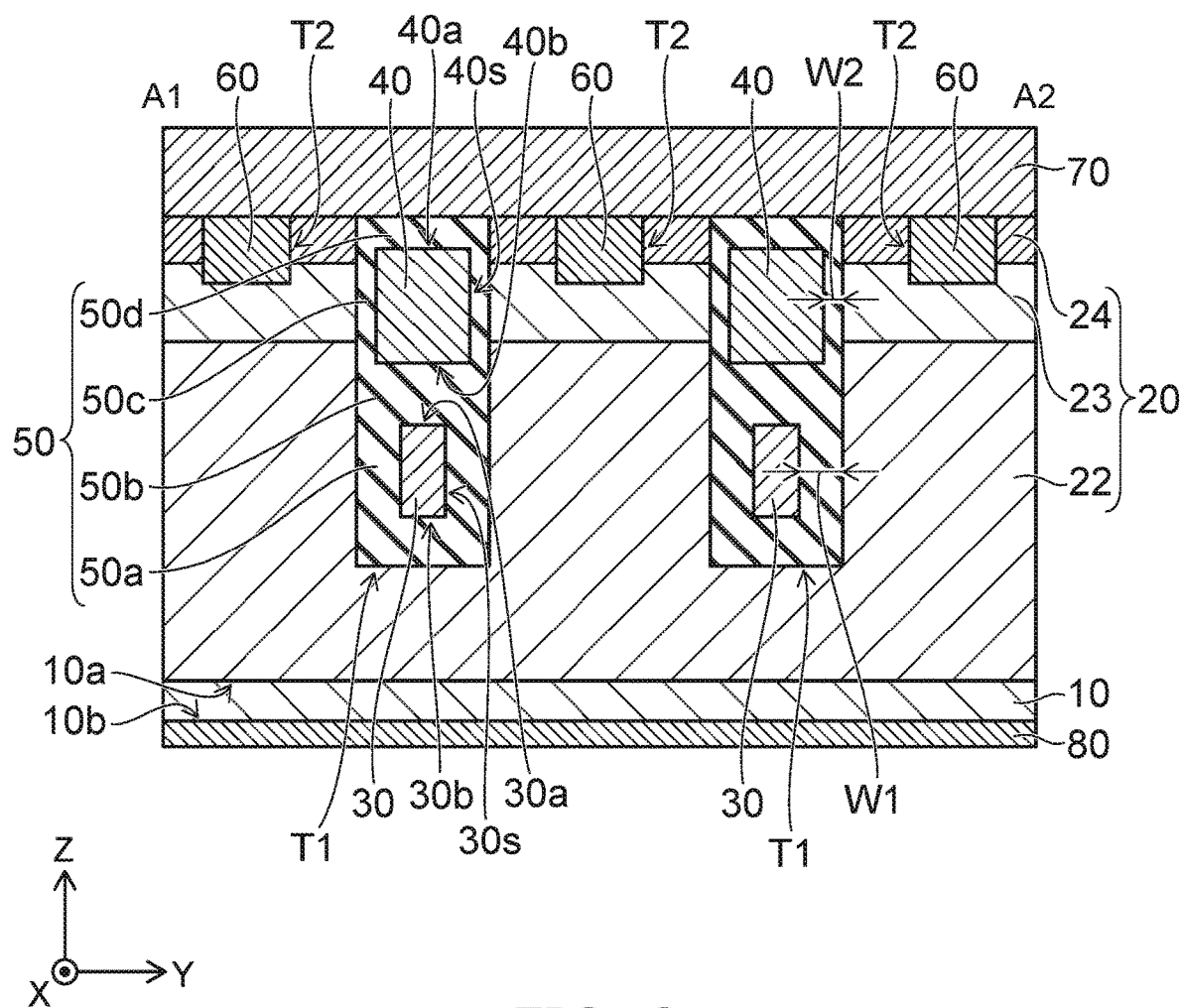
FIG. 3 is a cross-sectional view along line A1-A2 of FIG. 2.

As shown in FIG. 3, the semiconductor device 1 includes the substrate 10, the semiconductor layer 20, a field plate electrode 30, the gate electrode 40, the insulating film 50, a contact 60, the source electrode 70, and the drain electrode 80 in the region R1a of the element region R1.

The semiconductor layer 20 is provided on an upper surface 10a of the substrate 10. The semiconductor layer 20 is, for example, a silicon layer. The semiconductor layer 20 includes a drift layer 22, a base layer 23, and a source layer 24.

The drift layer 22 is provided on the substrate 10; and the conductivity type of the drift layer 22 is, for example, the $n^-$-type.

The base layer 23 is provided on the drift layer 22; and the conductivity type of the base layer 23 is, for example, the p-type.

The source layer 24 is provided selectively on the base layer 23; and the conductivity type of the source layer 24 is, for example, the $n^+$-type.

The field plate electrode 30 and the gate electrode 40 are formed inside the semiconductor layer 20 and are disposed inside a trench T1. The trench T1 is formed to reach the drift layer 22 from the upper surface of the source layer 24. For example, the trench T1 extends in the X-direction.

As shown in FIG. 2 and FIG. 3, the multiple trenches T1 that are arranged along the Y-direction are formed inside the semiconductor layer 20; and the field plate electrode 30 and the gate electrode 40 are disposed inside each of the trenches T1. That is, the semiconductor device 1 of the embodiment is a MOSFET having a trench gate structure, and includes the field plate electrode 30.

The field plate electrode 30 is positioned lower than the gate electrode 40; and the gate electrode 40 is positioned on the field plate electrode 30 with the insulating film 50 interposed. For example, the field plate electrode 30 and the gate electrode 40 each extend in the X-direction inside the trench T1. The field plate electrode 30 and the gate electrode 40 include, for example, polysilicon.

The insulating film 50 is disposed inside the trench T1. The insulating film 50 includes, for example, silicon oxide. The insulating film 50 may include, for example, a silicate glass such as BPSG, PSG, NSG, etc. The insulating film 50 may include, for example, silicon nitride or silicon oxynitride. The insulating film 50 includes a field plate insulating film 50a, an inter-layer insulating film 50b, a gate insulating film 50c, and an inter-layer insulating film 50d.

The field plate insulating film 50a is provided between the semiconductor layer 20 and the field plate electrode 30. The field plate insulating film 50a covers a lower surface 30b and a side surface 30s of the field plate electrode 30. For example, the field plate electrode 30 and the drift layer 22 oppose each other with the field plate insulating film 50a interposed.

The inter-layer insulating film 50b is provided between the field plate electrode 30 and the gate electrode 40. The inter-layer insulating film 50b covers an upper surface 30a of the field plate electrode 30 and a lower surface 40b of the gate electrode 40 and electrically insulates the field plate electrode 30 and the gate electrode 40.

The gate insulating film 50c is provided between the semiconductor layer 20 and the gate electrode 40. The gate insulating film 50c covers a side surface 40s of the gate electrode 40. For example, the gate electrode 40 opposes the drift layer 22, the base layer 23, and the source layer 24 with the gate insulating film 50c interposed.

The inter-layer insulating film 50d is provided between the gate electrode 40 and the source electrode 70. The inter-layer insulating film 50d covers an upper surface 40a of the gate electrode 40 and electrically insulates the gate electrode 40 and the source electrode 70.

A thickness W1 of the field plate insulating film 50a is larger than a thickness W2 of the gate insulating film 50c. In the region R1a of the element region R1, the maximum value of the thickness W1 is larger than the maximum value of the thickness W2.

In the specification, the thickness of the field plate insulating film 50a is the thickness of the field plate insulating film 50a positioned between the field plate electrode 30 and at least a portion of the semiconductor layer 20. For example, the thickness of the field plate insulating film 50a is the thickness in the Y-direction of the field plate insulating film 50a positioned on the side surface 30s of the field plate electrode 30.

The thickness of the gate insulating film 50c is the thickness of the gate insulating film 50c positioned between the gate electrode 40 and at least a portion of the semiconductor layer 20. For example, the thickness of the gate insulating film 50c is the thickness in the Y-direction of the gate insulating film 50c positioned on the side surface 40s of the gate electrode 40.

In the example shown in FIG. 3, the thickness W1 is the thickness in the Y-direction of the field plate insulating film 50a positioned between the field plate electrode 30 and a portion of the drift layer 22. The thickness W2 is the thickness in the Y-direction of the gate insulating film 50c positioned between the gate electrode 40 and a portion of the drift layer 22, between the gate electrode 40 and the base layer 23, and between the gate electrode 40 and a portion of the source layer 24.

The contact 60 is provided selectively on the base layer 23. For example, the contact 60 is provided inside a trench T2 formed between the source layers 24 adjacent to each other in the Y-direction. For example, the contact 60 is formed by filling titanium-tungsten (TiW), etc., into the trench T2. In such a case, the location directly under the trench T2 is caused to be of the p$^+$-type prior to filling the metal, etc. The contact 60 may be formed without forming the trench T2. In such a case, the contact 60 is formed by, for example, p$^+$-type ion implantation. By forming the contact 60, the connection resistance of the base layer 23 and the source electrode 70 can be reduced.

The source electrode 70 is provided on the source layer 24, the inter-layer insulating film 50d, and the contact 60. The source electrode 70 is electrically connected to the field plate electrode 30 at a not-illustrated portion. For example, the source electrode 70 has a two-layer structure including a barrier metal and a metal film.

The drain electrode 80 is provided on a lower surface 10b of the substrate 10.

Figure 4:
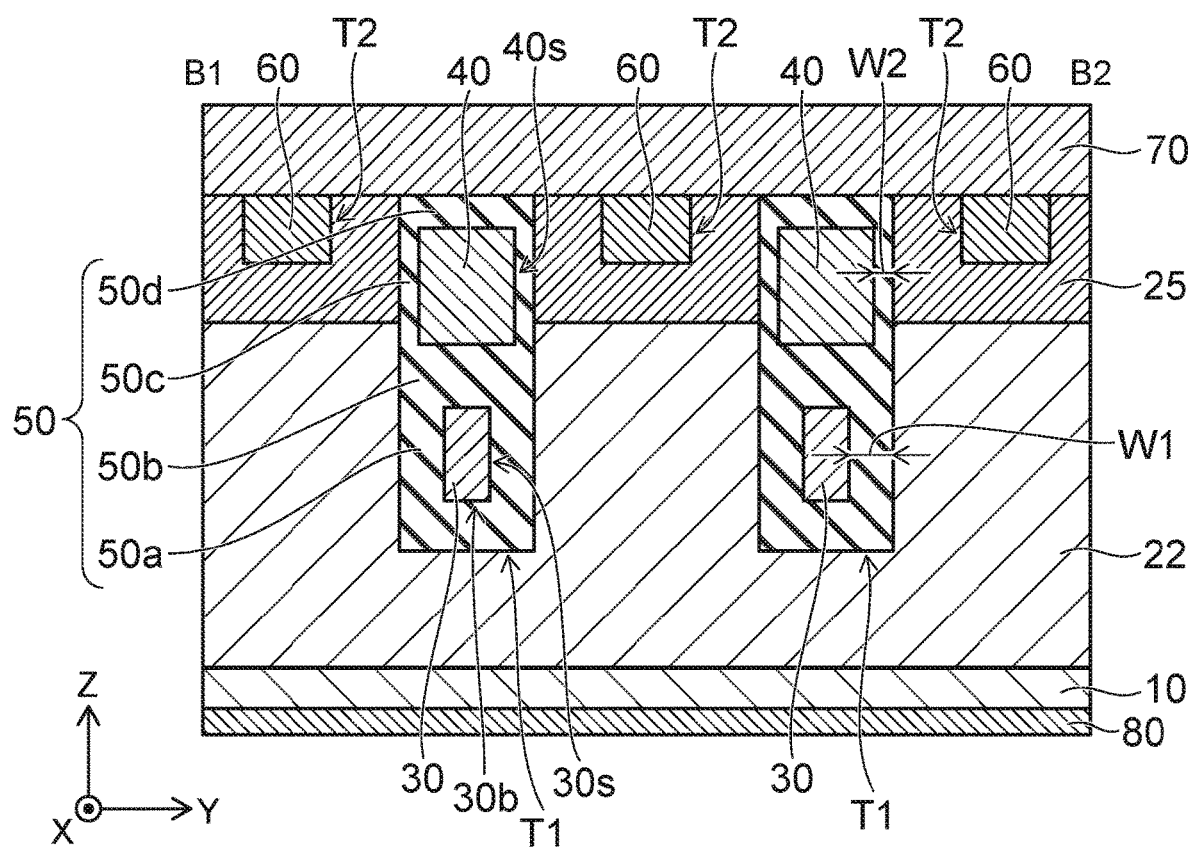
FIG. 4 is a cross-sectional view along line B1-B2 of FIG. 2.

As shown in FIG. 4, the semiconductor device 1 includes the substrate 10, the drift layer 22, a guard ring layer 25, the field plate electrode 30, the gate electrode 40, the insulating film 50, the contact 60, the source electrode 70, and the drain electrode 80 in the region R1b of the element region R1.

The guard ring layer 25 is provided on the drift layer 22 and is positioned between the trenches T1 adjacent to each other in the Y-direction. The guard ring layer 25 is a portion of the semiconductor layer 20. The conductivity type of the guard ring layer 25 is different from the conductivity type of the drift layer 22 and is, for example, the p-type. The guard ring layer 25 relaxes the electric field concentration occurring in the terminal region R2.

The insulating film 50 is disposed inside the trench T1 and includes the field plate insulating film 50a, the inter-layer insulating film 50b, the gate insulating film 50c, and the inter-layer insulating film 50d.

The field plate insulating film 50a covers the lower surface 30b and the side surface 30s of the field plate electrode 30. For example, the field plate electrode 30 and the drift layer 22 oppose each other with the field plate insulating film 50a interposed.

The gate insulating film 50c covers the side surface 40s of the gate electrode 40. For example, the gate electrode 40 opposes the drift layer 22 and the guard ring layer 25 with the gate insulating film 50c interposed.

The thickness of the field plate insulating film 50a in the region R1b of the element region R1 is substantially the same as the thickness W1 of the field plate insulating film 50a in the region R1a of the element region R1. The thickness of the gate insulating film 50c in the region R1b of the element region R1 is substantially the same as the thickness W2 of the gate insulating film 50c in the region R1a of the element region R1.

The terminal region R2 will now be described.

As shown in FIG. 2, the terminal region R2 includes a region R2a1, a region R2a2, and a region R2b. The region R2a1, the region R2a2, and the region R2b are arranged in order in a direction from the center of the element portion 8 toward the end portion of the element portion 8. That is, the region R2a1, the region R2a2, and the region R2b are arranged along the X-direction to be adjacent to each other.

Accordingly, the region R1a and R1b of the element region R1 and the regions R2a1, R2a2, and R2b of the terminal region R2 are arranged in order along the X-direction to be adjacent to each other.

Figure 5:
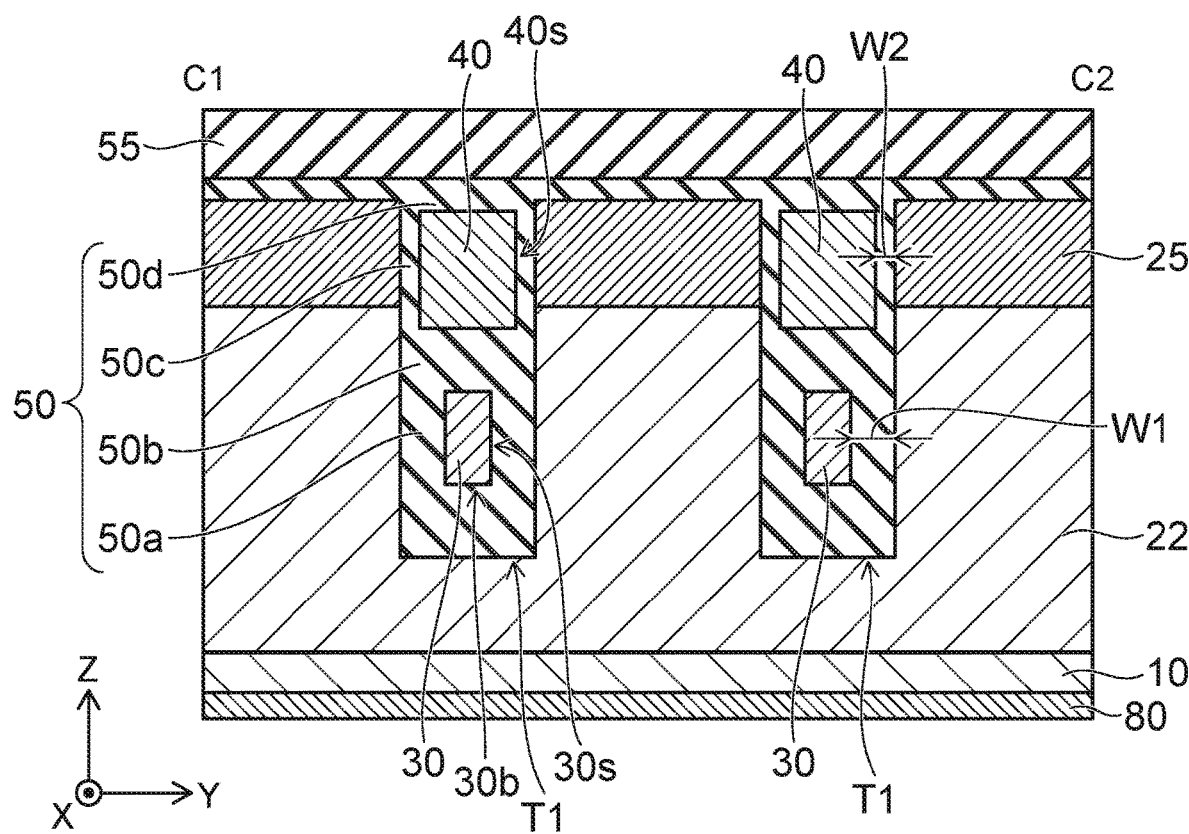
FIG. 5 is a cross-sectional view along line C1-C2 of FIG. 2.

As shown in FIG. 5, the semiconductor device 1 includes the substrate 10, the drift layer 22, the guard ring layer 25, the field plate electrode 30, the gate electrode 40, the insulating film 50, an inter-layer insulating film 55, and the drain electrode 80 in the region R2a1 of the terminal region R2.

The guard ring layer 25 is provided on the drift layer 22 and is positioned between the trenches T1 adjacent to each other in the Y-direction. The inter-layer insulating film 55 is provided on the insulating film 50 (the inter-layer insulating film 50d). The inter-layer insulating film 55 includes, for example, silicon oxide. The inter-layer insulating film 55 may include, for example, a silicate glass such as BPSG, PSG, NSG, etc. The inter-layer insulating film 55 may include, for example, silicon nitride or silicon oxynitride. The inter-layer insulating film 50d and the inter-layer insulating film 55 together may be called the inter-layer insulating film.

The insulating film 50 includes the field plate insulating film 50a, the inter-layer insulating film 50b, the gate insulating film 50c, and the inter-layer insulating film 50d disposed inside the trench T1.

The field plate insulating film 50a covers the lower surface 30b and the side surface 30s of the field plate electrode 30. For example, the field plate electrode 30 and the drift layer 22 oppose each other with the field plate insulating film 50a interposed.

The gate insulating film 50c covers the side surface 40s of the gate electrode 40. For example, the gate electrode 40 opposes the drift layer 22 and the guard ring layer 25 with the gate insulating film 50c interposed.

The thickness of the field plate insulating film 50a in the region R2a1 of the terminal region R2 is substantially the same as the thickness W1 of the field plate insulating film 50a in the region R1a of the element region R1. The thickness of the gate insulating film 50c in the region R2a1 of the terminal region R2 is substantially the same as the thickness W2 of the gate insulating film 50c in the region R1a of the element region R1.

Figure 6:
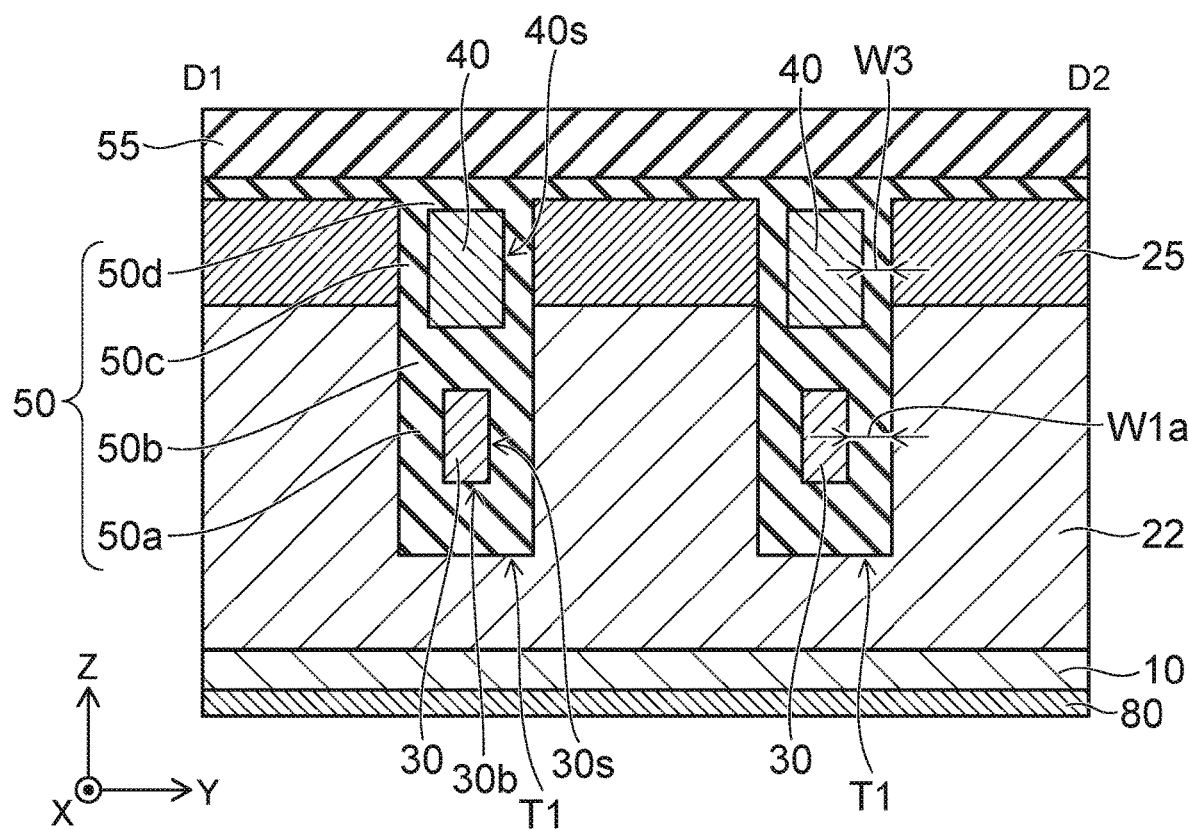
FIG. 6 is a cross-sectional view along line D1-D2 of FIG. 2.

As shown in FIG. 6, the semiconductor device 1 includes the substrate 10, the drift layer 22, the guard ring layer 25, the field plate electrode 30, the gate electrode 40, the insulating film 50, the inter-layer insulating film 55, and the drain electrode 80 in the region R2a2 of the terminal region R2. As shown in FIG. 2, the gate electrode 40 is connected to the pad 9, etc., via a contact 61.

The guard ring layer 25 is provided on the drift layer 22 and is positioned between the trenches T1 adjacent to each other in the Y-direction. The inter-layer insulating film 55 is provided on the insulating film 50 (the inter-layer insulating film 50d).

The insulating film 50 is disposed inside the trench T1 and includes the field plate insulating film 50a, the inter-layer insulating film 50b, the gate insulating film 50c, and the inter-layer insulating film 50d.

The field plate insulating film 50a covers the lower surface 30b and the side surface 30s of the field plate electrode 30. For example, the field plate electrode 30 and the drift layer 22 oppose each other with the field plate insulating film 50a interposed.

The gate insulating film 50c covers the side surface 40s of the gate electrode 40. For example, the gate electrode 40 opposes the drift layer 22 and the guard ring layer 25 with the gate insulating film 50c interposed.

A thickness W1a of the field plate insulating film 50a is larger than a thickness W3 of the gate insulating film 50c. In the region R2a2 of the terminal region R2, the maximum value of the thickness W1a is larger than the maximum value of the thickness W3.

In the example shown in FIG. 6, the thickness W1a is the thickness in the Y-direction of the field plate insulating film 50a positioned between the field plate electrode 30 and a portion of the drift layer 22. The thickness W3 is the thickness in the Y-direction of the gate insulating film 50c positioned between the gate electrode 40 and a portion of the drift layer 22 and between the gate electrode 40 and a portion of the guard ring layer 25.

The thickness W1a of the field plate insulating film 50a in the region R2a2 of the terminal region R2 is substantially the same as the thickness W1 of the field plate insulating film 50a in the region R1a of the element region R1.

The thickness W3 of the gate insulating film 50c in the region R2a2 of the terminal region R2 is thicker than the thickness W2 of the gate insulating film 50c in the region R1a of the element region R1. The maximum value of the thickness W3 in the region R2a2 is larger than the maximum value of the thickness W2 in the region R1a.

For example, the thickness W3 is not less than 1.3 times the thickness W2.

Figure 7:
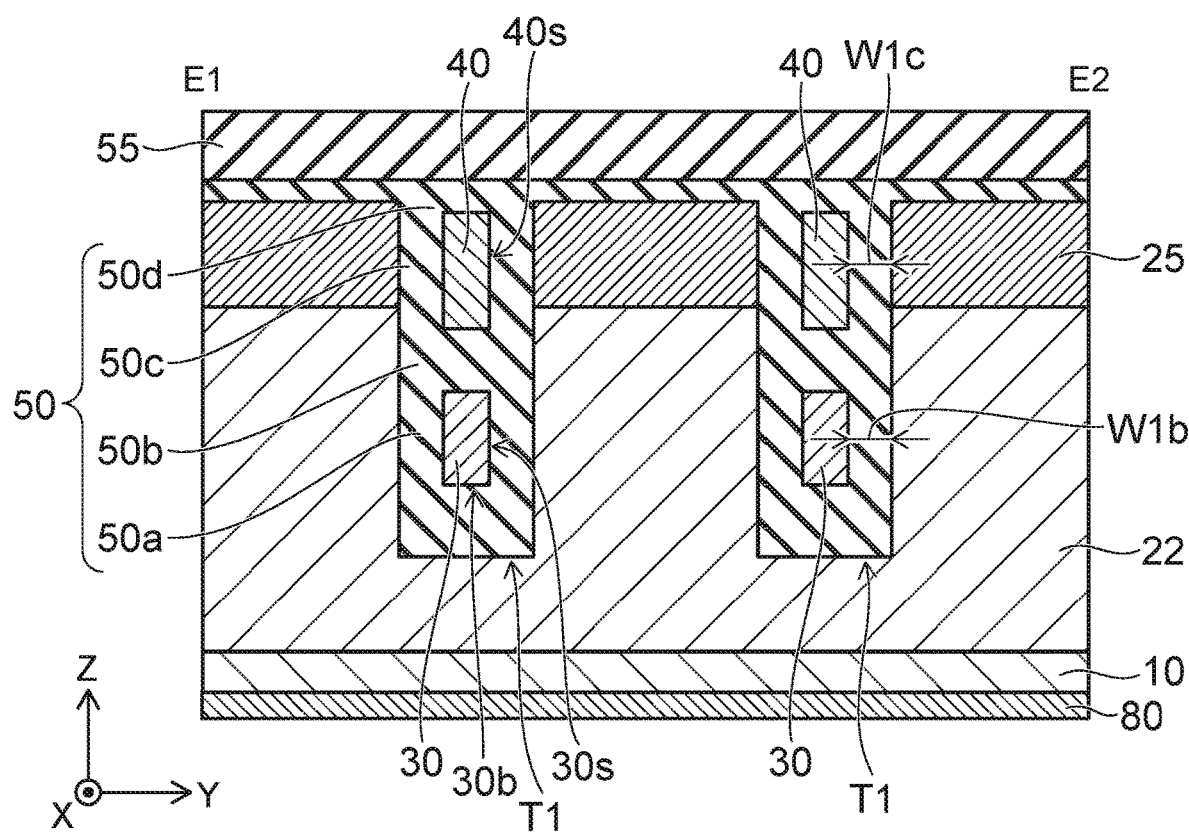
FIG. 7 is a cross-sectional view along line E1-E2 of FIG. 2.

As shown in FIG. 7, the semiconductor device 1 includes the substrate 10, the drift layer 22, the guard ring layer 25, the field plate electrode 30, the gate electrode 40, the insulating film 50, the inter-layer insulating film 55, and the drain electrode 80 in the region R2b of the terminal region R2.

The insulating film 50 is disposed inside the trench T1 and includes the field plate insulating film 50a, the inter-layer insulating film 50b, the gate insulating film 50c, and the inter-layer insulating film 50d.

The field plate insulating film 50a covers the lower surface 30b and the side surface 30s of the field plate electrode 30. For example, the field plate electrode 30 and the drift layer 22 oppose each other with the field plate insulating film 50a interposed.

The gate insulating film 50c covers the side surface 40s of the gate electrode 40. For example, the gate electrode 40 opposes the drift layer 22 and the guard ring layer 25 with the gate insulating film 50c interposed.

A thickness W1b of the field plate insulating film 50a is substantially the same as a thickness W1c of the gate insulating film 50c.

In the example shown in FIG. 7, the thickness W1b is the thickness in the Y-direction of the field plate insulating film 50a positioned between the field plate electrode 30 and a portion of the drift layer 22. The thickness W1c is the thickness in the Y-direction of the gate insulating film 50c positioned between the gate electrode 40 and a portion of the drift layer 22 and between the gate electrode 40 and a portion of the guard ring layer 25.

The thickness W1b of the field plate insulating film 50a in the region R2b of the terminal region R2 is substantially the same as the thickness W1 of the field plate insulating film 50a in the region R1a of the element region R1.

The thickness W1c of the gate insulating film 50c in the region R2b of the terminal region R2 is thicker than the thickness W3 of the gate insulating film 50c in the region R2a2 of the terminal region R2. The maximum value of the thickness W1c in the region R2b of the terminal region R2 is larger than the maximum value of the thickness W3 in the region R2a2 of the terminal region R2.

Thus, for the element region R1 and the terminal region R2, the thicknesses W1, W1a, and W1b of the field plate insulating film 50a and the thicknesses W2, W3, and W1c of the gate insulating film 50c satisfy the following relational expression (1).

$$W1(W1a, W1b, \text{ and } W1c) > W3 > W2 \qquad (1)$$

Because the thicknesses W2, W3, and W1c of the gate insulating film 50c satisfy Formula (1) recited above, the thickness of the gate insulating film 50c increases in stages through the terminal region R2 from the element region R1. Thereby, as shown in FIG. 2, for example, the gate electrode 40 is provided so that a thickness Wg of the gate electrode 40 decreases in stages through the terminal region R2 from the element region R1.

Operations of the semiconductor device 1 will now be described.

In the semiconductor device 1 of the embodiment, a vertical n-channel MOSFET is formed of the semiconductor layer 20 (the drift layer 22, the base layer 23, and the source layer 24), the field plate electrode 30, the gate electrode 40, the insulating film 50, the contact 60, the source electrode 70, and the drain electrode 80.

For this transistor, when a prescribed voltage is applied to the gate electrode 40 in the state in which a voltage that is positive with respect to the source electrode 70 is applied to the drain electrode 80, a channel (an inversion layer) is formed in the base layer 23 at the gate insulating film 50c vicinity; and the semiconductor device 1 is switched to the on-state. Electrons flow from the source electrode 70 through the channel into the drain electrode 80. That is, an electron current flows from the source layer 24 toward the drift layer 22.

An example of the connection state of the semiconductor device 1 will now be described.

Figure 8A:
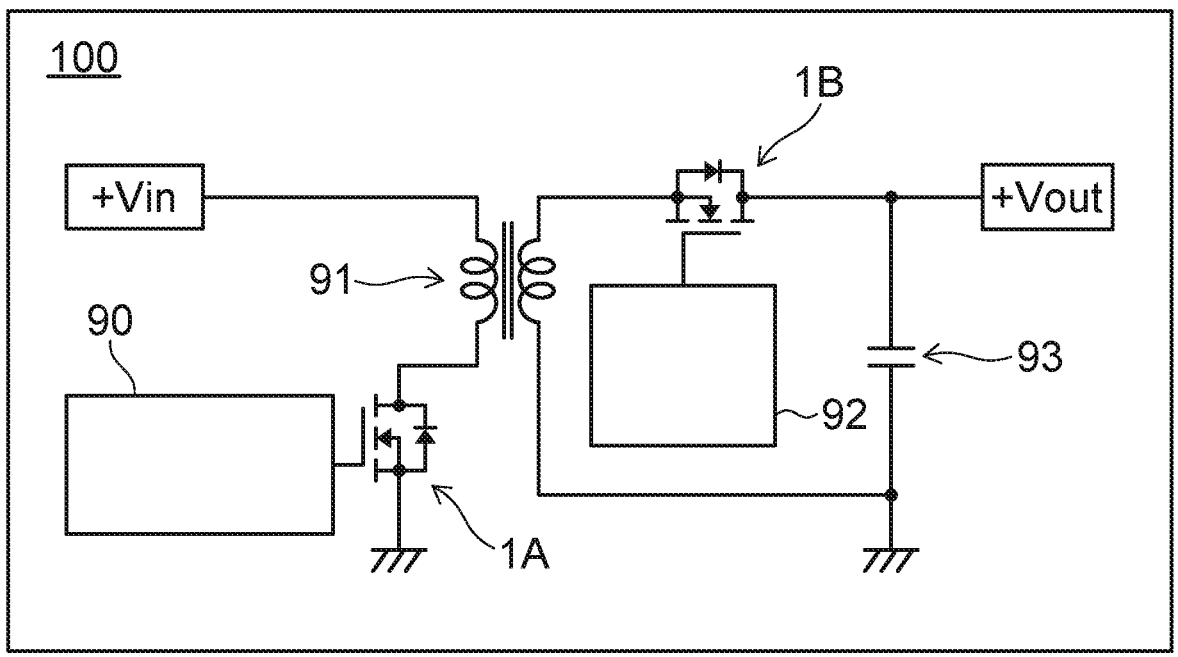
FIG. 8A and FIG. 8B are circuit diagrams showing connection states of the semiconductor device.
Figure 8B:
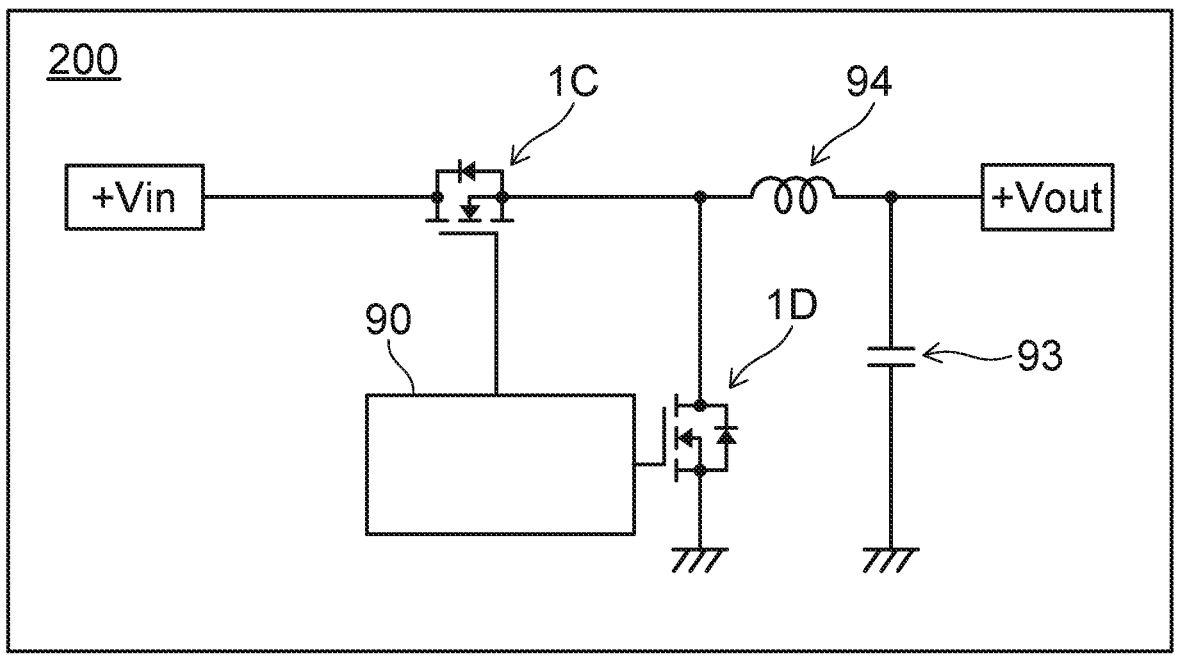

FIG. 8A and FIG. 8B are circuit diagrams showing connection states of the semiconductor device 1 inside converters. FIG. 8A shows a circuit diagram of an AC-DC converter 100; and FIG. 8B shows a circuit diagram of a DC-DC converter 200.

In the AC-DC converter 100 as shown in FIG. 8A, a semiconductor device 1A is connected to a control circuit 90 and a transformer 91. A semiconductor device 1B is connected to the transformer 91 and a drive circuit 92. The semiconductor devices 1A and 1B are, for example, MOSFETs. A condenser 93 also is connected to the semiconductor device 1B and the transformer 91.

In the AC-DC converter 100, an AC voltage is input, converted, and output as a DC voltage.

In the DC-DC converter 200 as shown in FIG. 8B, a semiconductor device 1C is provided on the high potential side and is connected to the control circuit 90 and a coil 94. A semiconductor device 1D is provided on the low potential side and is connected to the control circuit 90. The semiconductor device 1D is connected between the semiconductor device 1C and the coil 94. The semiconductor devices 1C and 1D are, for example, MOSFETs. The condenser 93 is connected to the coil 94.

In the DC-DC converter 200, a DC voltage is input, converted, and output as a DC voltage.

Effects of the embodiment will now be described.

In the semiconductor device 1 according to the embodiment, the gate insulating film 50c is provided so that the thicknesses W2, W3, and W1c increase in stages through the terminal region R2 from the element region R1. By forming the gate insulating film 50c in the region R2a2 of the terminal region R2 to have the thickness W3 which is thinner than the thickness W1c and thicker than the thickness W2, the avalanche resistance at turn-off of the semiconductor device 1 can be improved.

Here, to perform the turn-off at a high speed in a semiconductor device such as a MOSFET, etc., there are cases where a reverse-biased voltage is applied to the gate electrode in the off-operation of the switching. When performing the turn-off at a high speed, the breakdown voltage of the region between the source electrode and the drain electrode is affected easily by the components inside the terminal region. For example, when an excessive voltage is applied to the region between the source electrode and the drain electrode, avalanche breakdown occurs; and an electron current and/or a hole current is generated. The electron current and/or the hole current that is generated flows from the guard ring layer into the base layer that has a low potential. That is, a hole current flows from the terminal region into the element region in the case of an n-channel MOSFET; and an electron current flows from the terminal region into the element region in the case of a p-channel field effect transistor.

In the case where the semiconductor device is the n-channel MOSFET, the potential increases due to the resistance of the base layer when the hole current flows from the guard ring layer into the base layer; therefore, a forward bias voltage is applied to the gate electrode and the gate insulating film. When the reverse-biased voltage is applied to the gate electrode in the off-operation of the switching, there are cases where an excessive electric field is applied to the gate insulating film when the carriers are discharged. In such a case, there is a risk that the gate insulating film may breakdown in the terminal region.

In the semiconductor device 1 according to the embodiment, the thickness of the gate insulating film 50c is changed to have thicknesses having three stages (e.g., the thicknesses W2, W3, and W1c) through the terminal region R2 from the element region R1. Thus, by changing the thickness of the gate insulating film 50c in stages, the electric field that is applied to the gate insulating film 50c when avalanche breakdown occurs can be relaxed. Thereby, even in the state in which the reverse-biased voltage is applied to the gate electrode at turn-off of the semiconductor device 1, the avalanche resistance is improved; and the breakdown of the gate insulating film can be suppressed.

Although the thickness of the gate insulating film 50c is changed to have thicknesses having three stages such as the thicknesses W2, W3, and W1c through the terminal region R2 from the element region R1 in the embodiment, it is sufficient to increase the thickness of the gate insulating film 50c in stages through the terminal region R2 from the element region R1. For example, the thickness of the gate insulating film 50c may be changed to have thicknesses having four or more stages through the terminal region R2 from the element region R1.

According to the embodiment, a semiconductor device that has a higher breakdown voltage can be provided.

Second Embodiment

Figure 9:
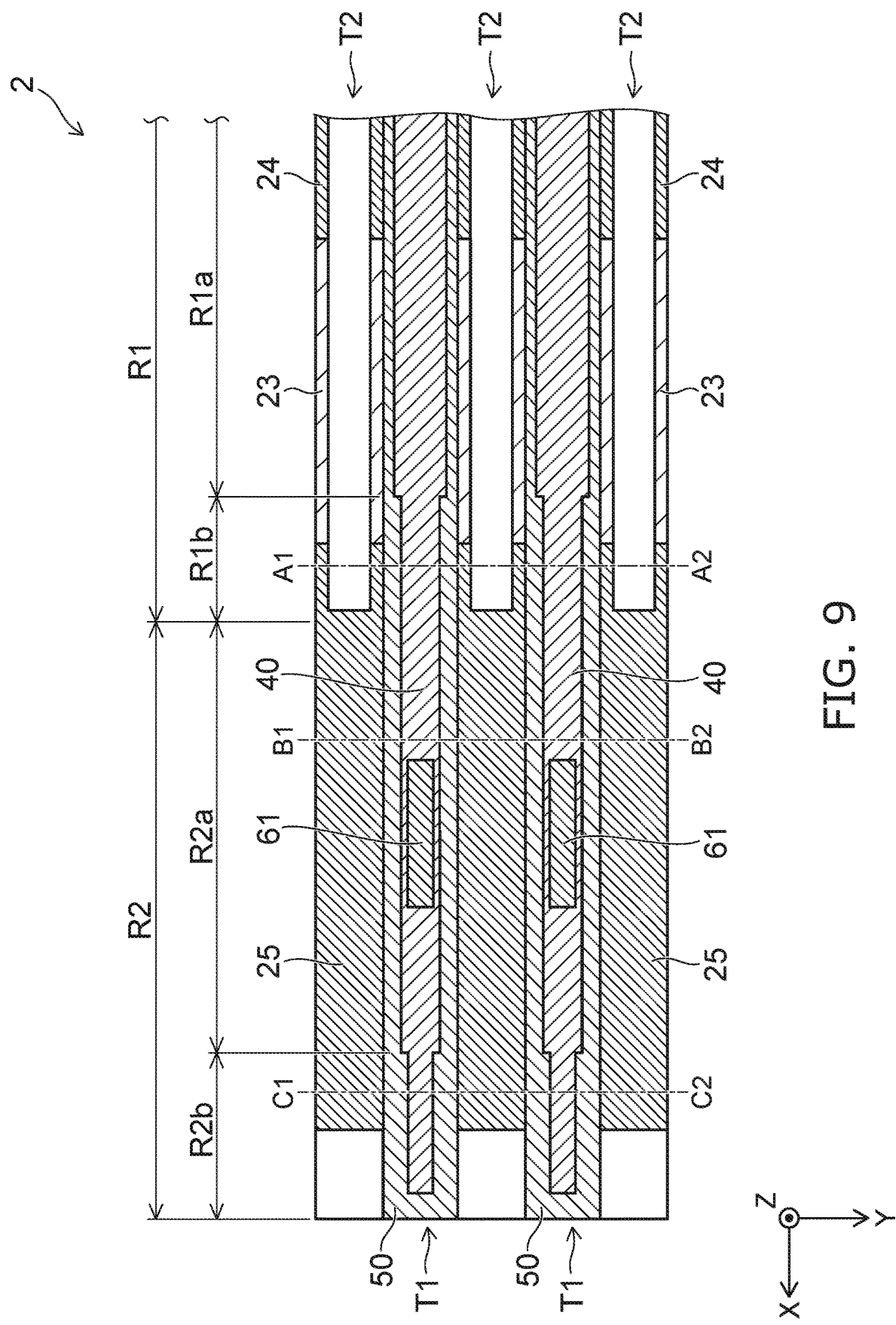
FIG. 9 is a plan view showing a semiconductor device according to a second embodiment.
Figure 10:
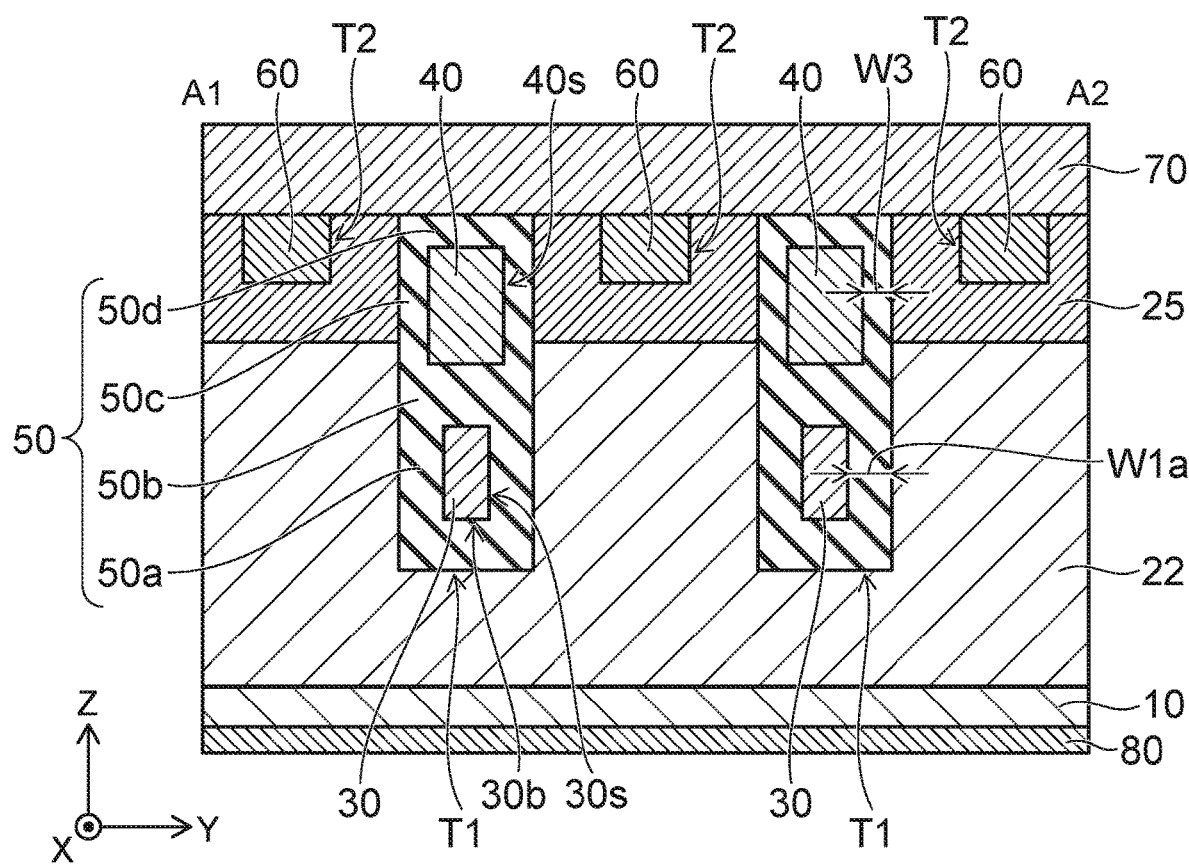
FIG. 10 is a cross-sectional view along line A1-A2 of FIG. 9.
Figure 11:
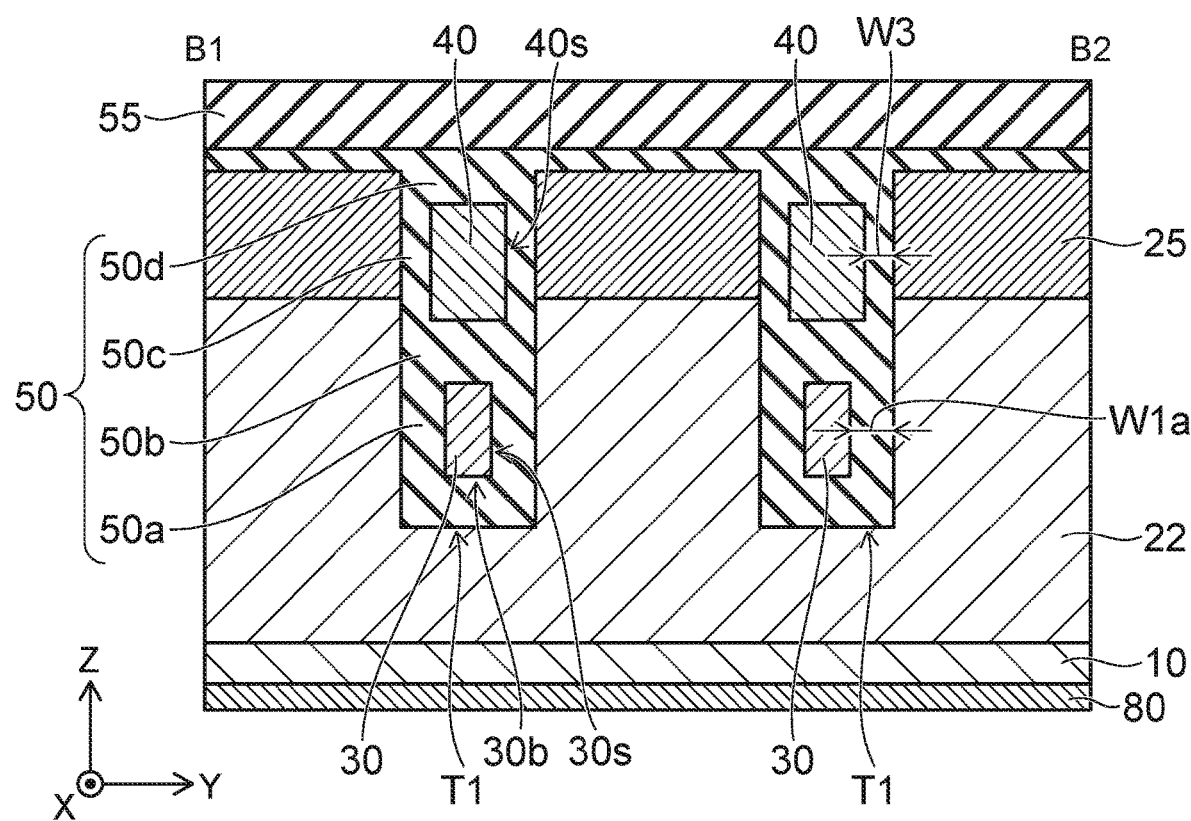
FIG. 11 is a cross-sectional view along line B1-B2 of FIG. 9.
Figure 12:
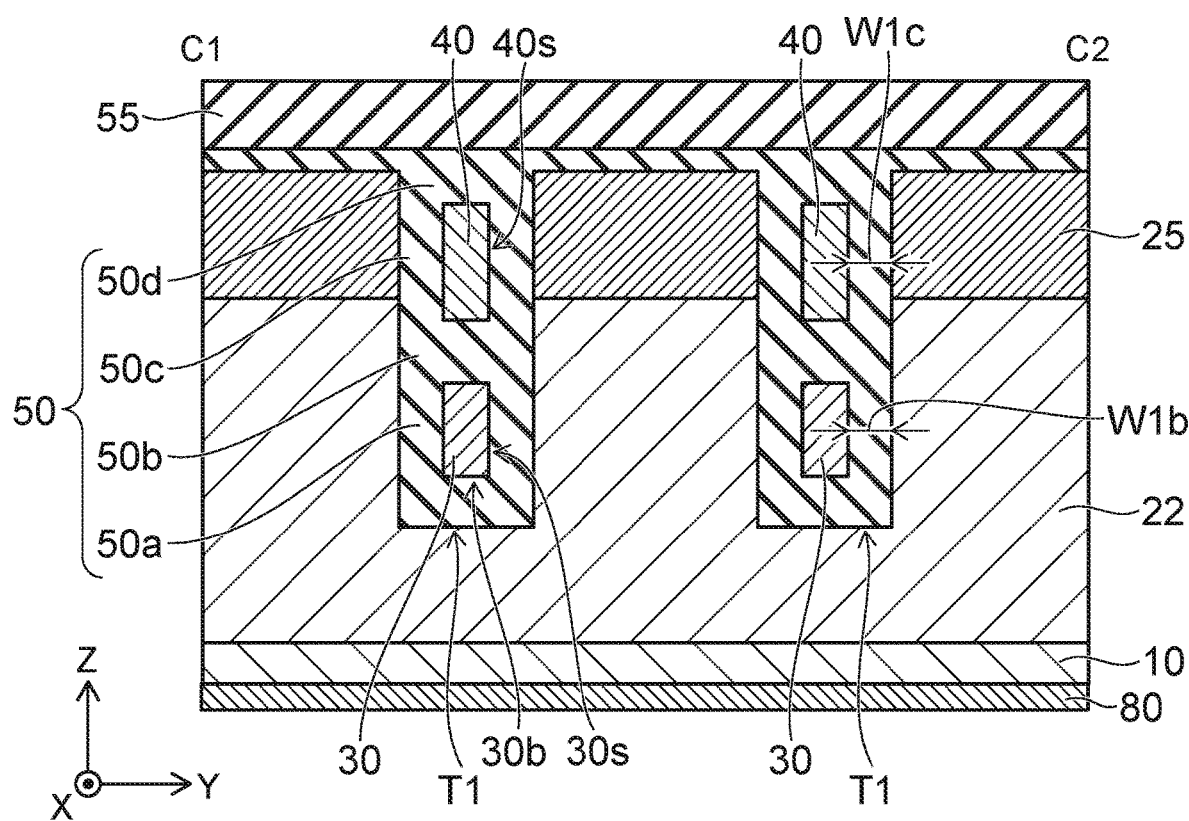
FIG. 12 is a cross-sectional view along line C1-C2 of FIG. 9.

FIG. 9 is a plan view showing a semiconductor device according to the embodiment. FIG. 10, FIG. 11, and FIG. 12 are cross-sectional views along line A1-A2, line B1-B2, and line C1-C2 of FIG. 9.

As shown in FIG. 9, the element region R1 and the terminal region R2 are provided in the semiconductor device 2 according to the embodiment. The element region R1 includes the region R1a and the region R1b; and the terminal region R2 includes a region R2a and the region R2b. The region R1a and R1b of the element region R1 and the regions R2a and R2b of the terminal region R2 are arranged in order along the X-direction to be adjacent to each other.

The thickness of the gate insulating film 50c formed in each region of the embodiment differs from that of the first embodiment. Otherwise, a detailed description of the configuration is therefore omitted.

The thickness of the field plate insulating film 50a is substantially the same in the region R1a and R1b of the element region R1 and the regions R2a and R2b of the terminal region R2.

The gate insulating film 50c has the thickness W2 in the region R1a of the element region R1.

In the region R1b of the element region R1 as shown in FIG. 10, the thickness W1a of the field plate insulating film 50a is thicker than the thickness W3 of the gate insulating film 50c. For the gate insulating film 50c, the thickness W3 is thicker than the thickness W2.

In the region R2a of the terminal region R2 as shown in FIG. 11, the thickness of the field plate insulating film 50a is substantially the same as the thickness W1a; and the thickness of the gate insulating film 50c is substantially the same as the thickness W3.

In the region R2b of the terminal region R2 as shown in FIG. 12, the thickness W1b of the field plate insulating film 50a is substantially the same as the thickness W1c of the gate insulating film 50c. For the gate insulating film 50c, the thickness W1c is thicker than the thickness W3.

Thus, in the element region R1 and the terminal region R2, the thicknesses W1, W1a, and W1b of the field plate insulating film 50a and the thicknesses W2, W3, and W1c of the gate insulating film 50c satisfy the relational expression (1) described above.

In the embodiment, the gate insulating film 50c is provided so that the thicknesses W2, W3, and W1c increase in stages through the terminal region R2 from the element region R1. That is, the gate insulating film 50c is provided from the region R1b of the element region R1 to the region R2a of the terminal region R2 to have the thickness W3 which is thinner than the thickness W1c and thicker than the thickness W2. In the region R1b as shown in FIG. 9 and FIG. 10, the gate-drain capacitance (Cgd) can be reduced because the thickness W3 of the gate insulating film 50c opposing the drift layer 22 which has the drain potential is thick compared to the thickness W2 of the gate insulating film 50c of the first embodiment (referring to FIG. 4).

Otherwise, the effects of the embodiment are similar to those of the first embodiment described above.

Third Embodiment

Figure 13:
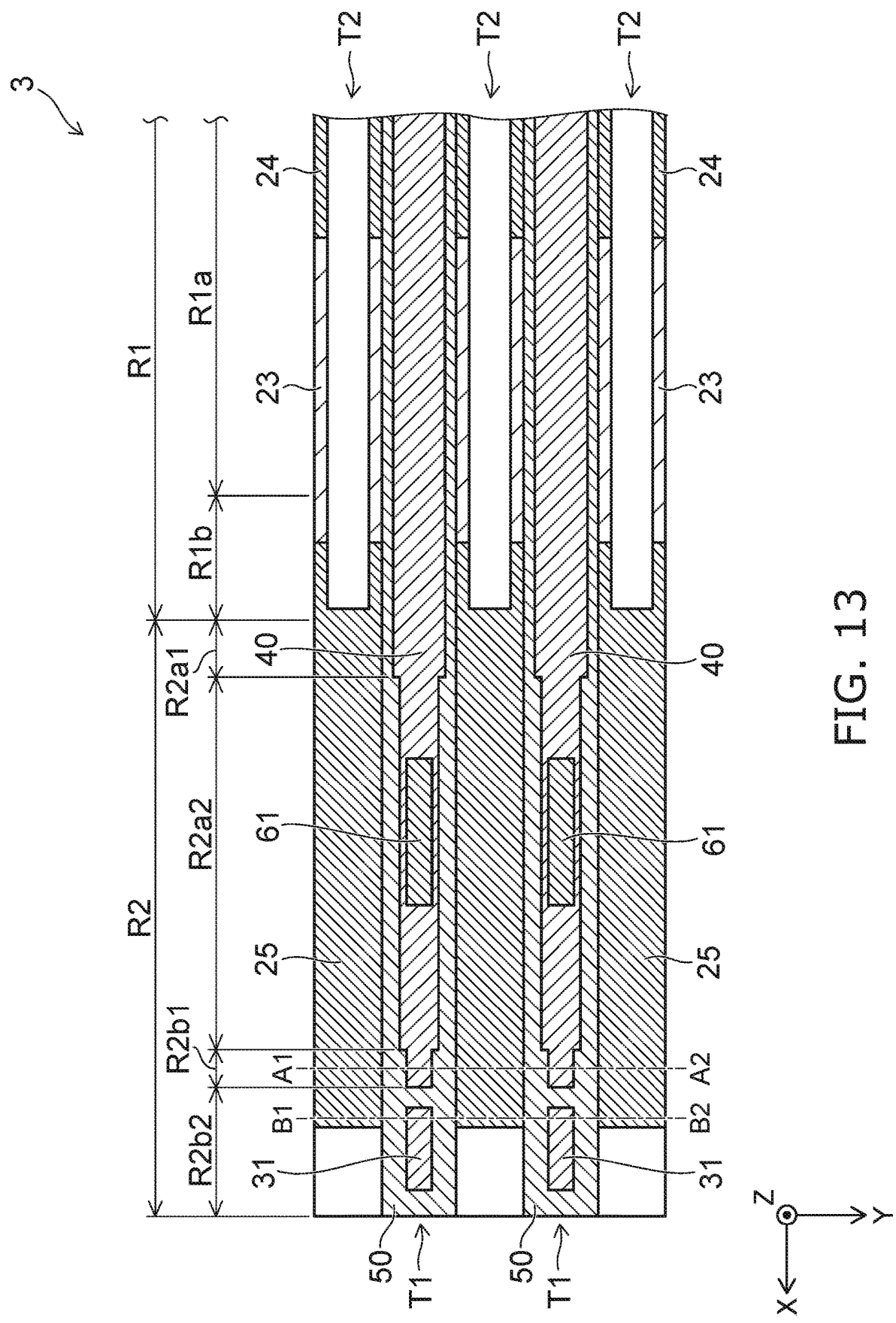
FIG. 13 is a plan view showing a semiconductor device according to a third embodiment.
Figure 14:
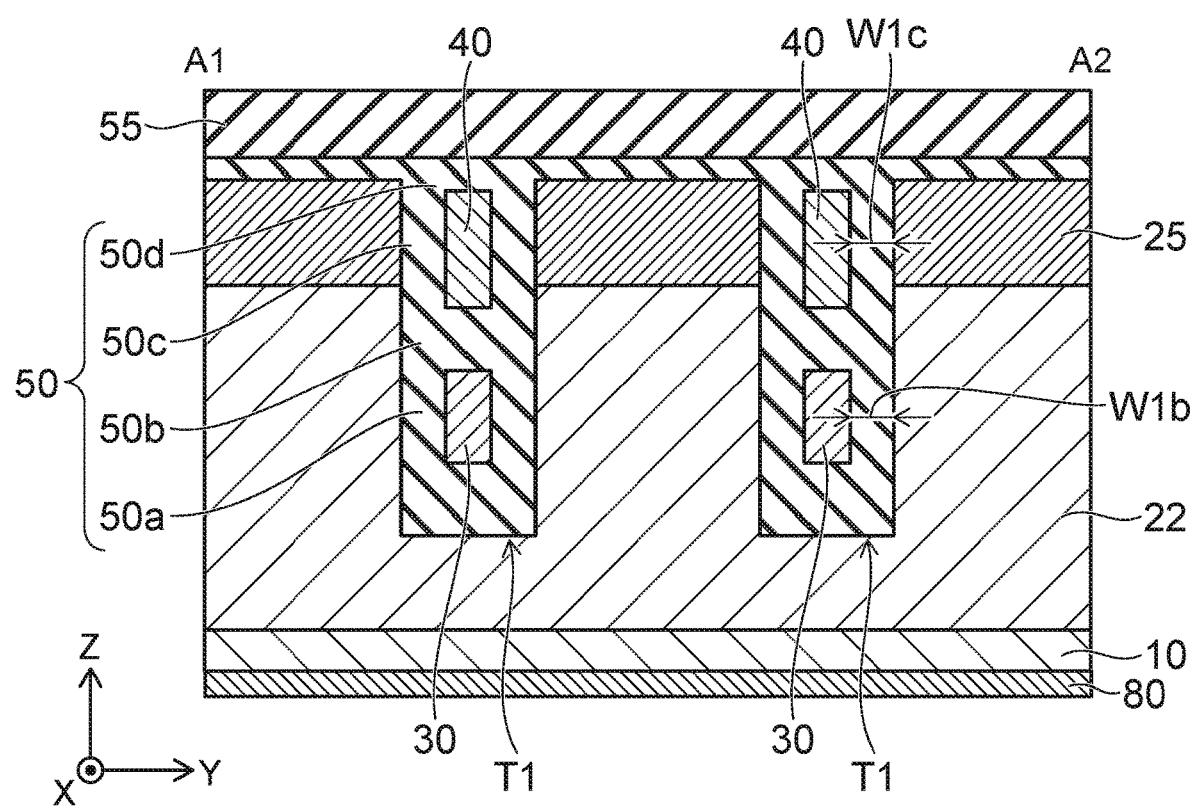
FIG. 14 is a cross-sectional view along line A1-A2 of FIG. 13.
Figure 15:
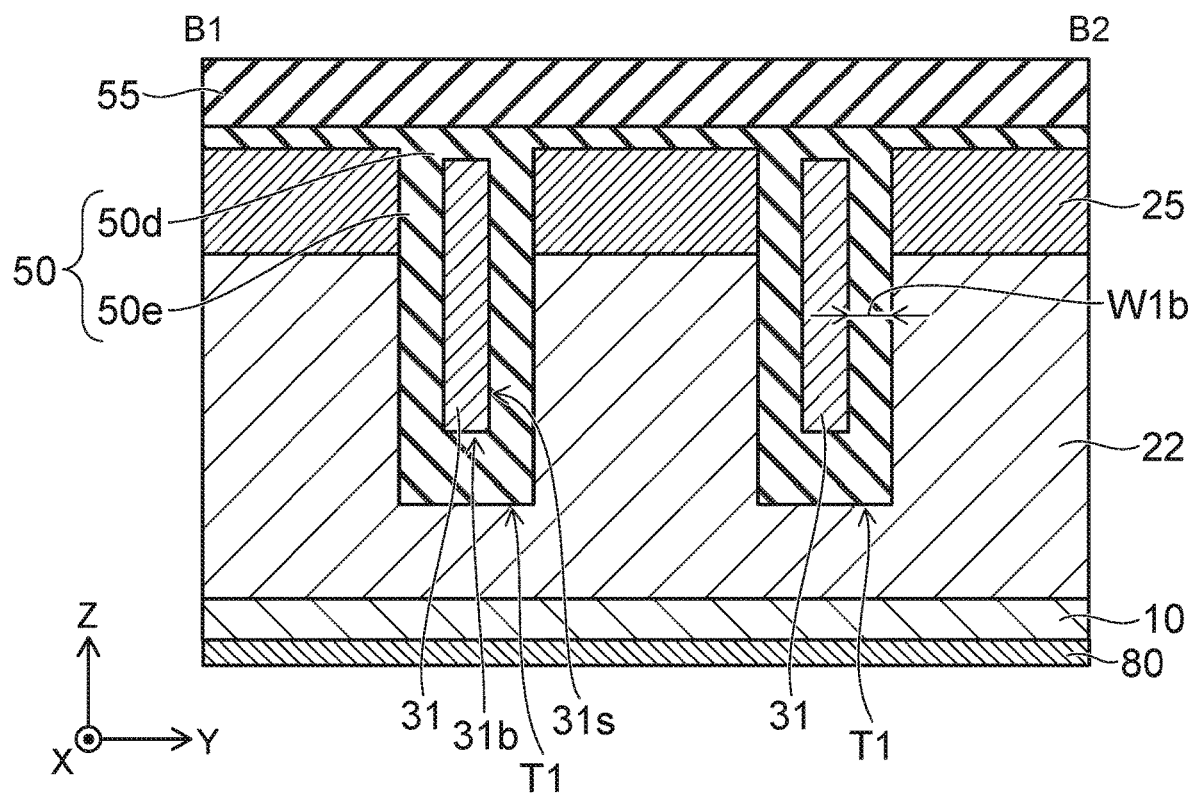
FIG. 15 is a cross-sectional view along line B1-B2 of FIG. 13.

FIG. 13 is a plan view showing a semiconductor device according to the embodiment. FIG. 14 and FIG. 15 are cross-sectional views along line A1-A2 and line B1-B2 of FIG. 13.

As shown in FIG. 13, the element region R1 and the terminal region R2 are provided in the semiconductor device 3 according to the embodiment. The element region R1 includes the region R1a and the region R1b; and the terminal region R2 includes the region R2a1, the region R2a2, a region R2b1, and a region R2b2. The region R1a and R1b of the element region R1 and the regions R2a1, R2a2, R2b1, and R2b2 of the terminal region R2 are arranged in order along the X-direction to be adjacent to each other.

The configuration of the element region R1 and the configurations of the regions R2a1 and R2a2 of the terminal region R2 in the embodiment are the same as those of the first embodiment. A detailed description of these configurations is therefore omitted.

As shown in FIG. 14, the semiconductor device 3 includes the substrate 10, the drift layer 22, the guard ring layer 25, the field plate electrode 30, the gate electrode 40, the insulating film 50, the inter-layer insulating film 55, and the drain electrode 80 in a region R2b1 of the terminal region R2.

The thickness W1b of the field plate insulating film 50a is substantially the same as the thickness W1c of the gate insulating film 50c. For the gate insulating film 50c, the thickness W1c is thicker than the thickness W3. The thickness W3 is the thickness of the gate insulating film 50c in the region R2a2 of the terminal region R2.

As shown in FIG. 15, the semiconductor device 3 includes the substrate 10, the drift layer 22, the guard ring layer 25, a field plate electrode 31, the insulating film 50, the inter-layer insulating film 55, and the drain electrode 80 in a region R2b2 of the terminal region R2.

The insulating film 50 is disposed inside the trench T1 and includes the inter-layer insulating film 50d and a field plate insulating film 50e.

The field plate insulating film 50e covers a lower surface 31b and a side surface 31s of the field plate electrode 31. The field plate electrode 31 opposes the drift layer 22 and the guard ring layer 25 with the field plate insulating film 50e interposed.

The thickness of the field plate insulating film 50e is substantially the same as the thickness W1b of the field plate insulating film 50a in the region R2b1 of the terminal region R2.

Thus, in the element region R1 and the terminal region R2, the thicknesses W1, W1a, and W1b of the field plate insulating film 50a and the thicknesses W2, W3, and W1c of the gate insulating film 50c satisfy the relational expression (1) described above.

In the embodiment, the gate-drain capacitance (Cgd) can be reduced because the field plate electrode 31 is formed in the region R2b1 of the terminal region R2 which has the drain potential.

Otherwise, the effects of the embodiment are similar to those of the first embodiment described above.

Fourth Embodiment

Figure 16:
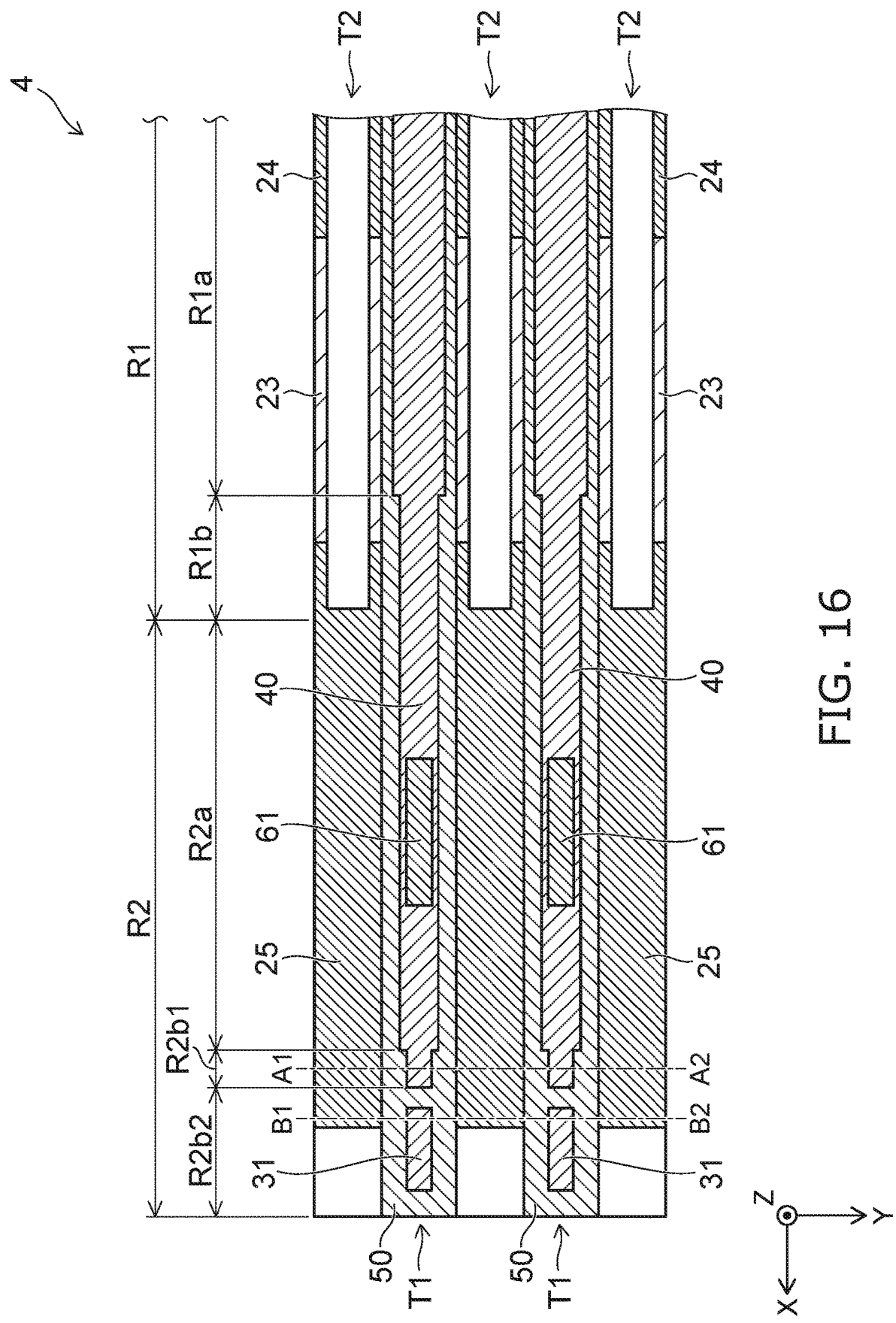
FIG. 16 is a plan view showing a semiconductor device according to a fourth embodiment.
Figure 17:
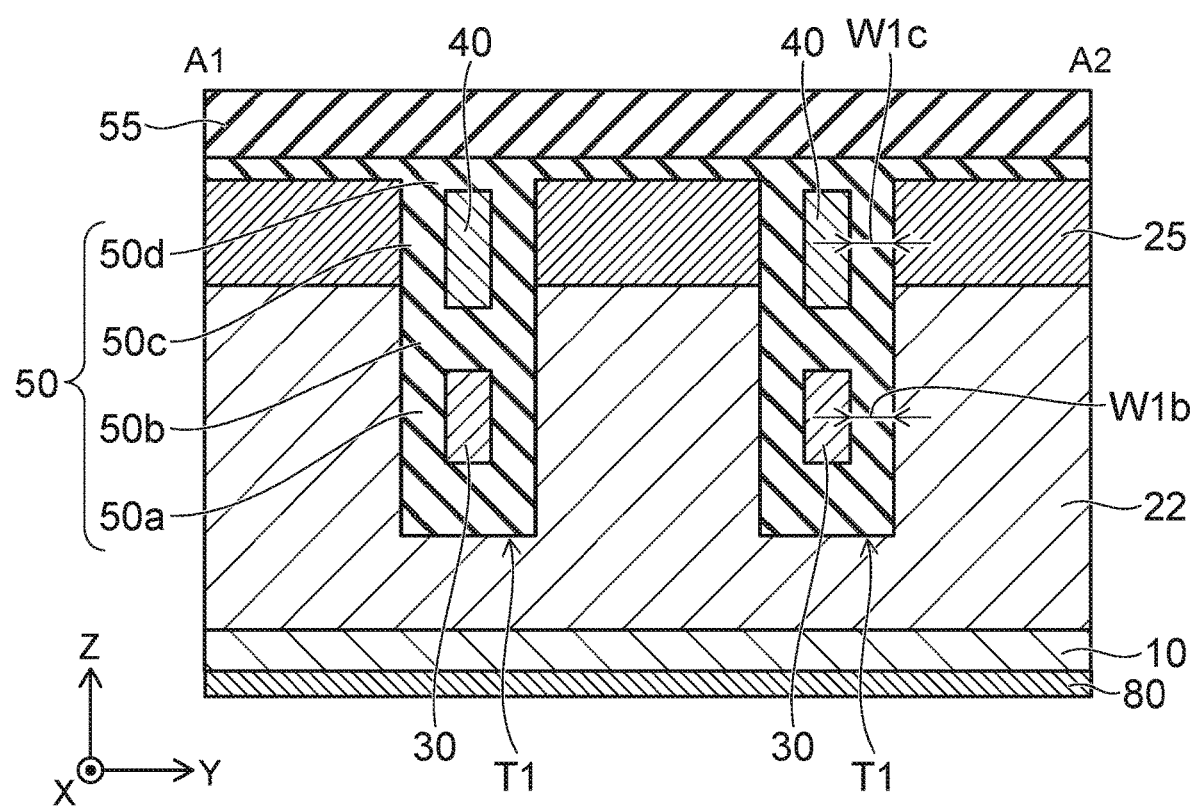
FIG. 17 is a cross-sectional view along line A1-A2 of FIG. 16.
Figure 18:
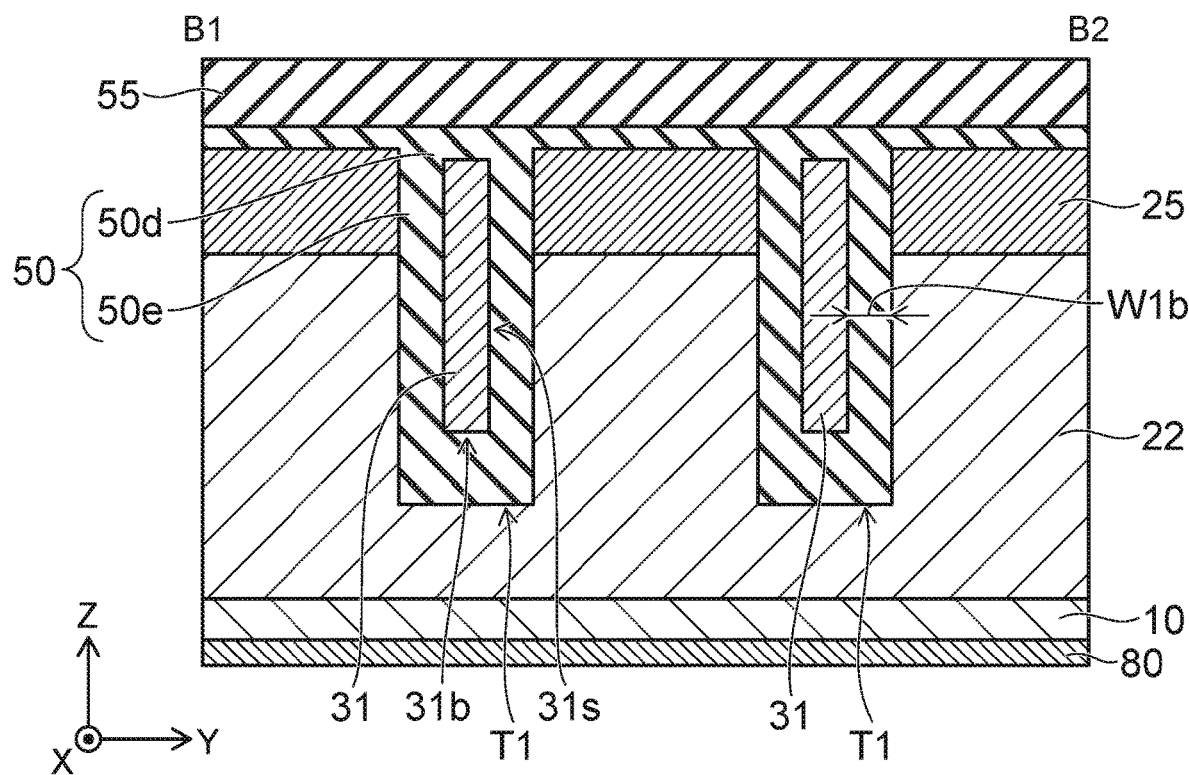
FIG. 18 is a cross-sectional view along line B1-B2 of FIG. 16.

FIG. 16 is a plan view showing a semiconductor device according to the embodiment. FIG. 17 and FIG. 18 are cross-sectional views along line A1-A2 and line B1-B2 of FIG. 16.

As shown in FIG. 16, the element region R1 and the terminal region R2 are provided in the semiconductor device 4 according to the embodiment. The element region R1 includes the region R1a and the region R1b; and the terminal region R2 includes the region R2a, the region R2b1, and the region R2b2. The region R1a and R1b of the element region R1 and the regions R2a, R2b1, and R2b2 of the terminal region R2 are arranged in order along the X-direction to be adjacent to each other.

The configuration of the element region R1 and the configuration of the region R2a of the terminal region R2 of the embodiment are the same as those of the second embodiment.

A detailed description of these configurations is therefore omitted.

In the region R2b1 of the terminal region R2 as shown in FIG. 17, the thickness W1b of the field plate insulating film 50a is substantially the same as the thickness W1c of the gate insulating film 50c. For the gate insulating film 50c, the thickness W1c is thicker than the thickness W3. The thickness W3 is the thickness of the gate insulating film 50c in the region R1b of the element region R1.

As shown in FIG. 18, the thickness of the field plate insulating film 50e in the region R2b2 of the terminal region R2 is substantially the same as the thickness W1b of the field plate insulating film 50a in the region R2b1 of the terminal region R2.

Thus, in the element region R1 and the terminal region R2, the thicknesses W1, W1a, and W1b of the field plate insulating film 50a and the thicknesses W2, W3, and W1c of the gate insulating film 50c satisfy the relational expression (1) described above.

In the embodiment, the gate-drain capacitance (Cgd) can be reduced because the field plate electrode 31 is formed in the region R2b2 of the terminal region R2 which has the drain potential.

Otherwise, the effects of the embodiment are similar to those of the second embodiment described above.

Fifth Embodiment

Figure 19:
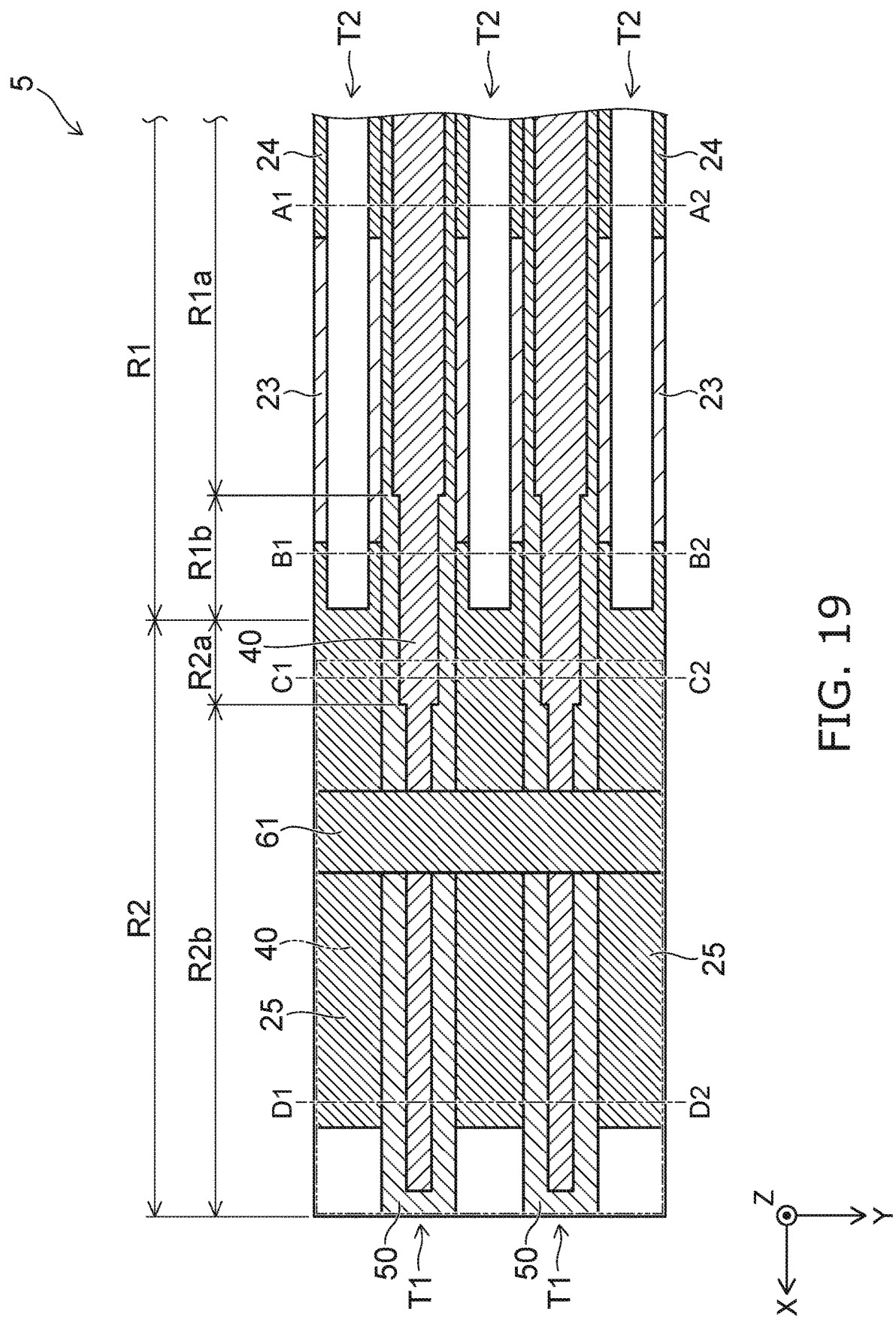
FIG. 19 is a plan view showing a semiconductor device according to a fifth embodiment.

FIG. 19 is a plan view showing a semiconductor device according to the embodiment. FIG. 20, FIG. 21, FIG. 22, and FIG. 23 are cross-sectional views along line A1-A2, line B1-B2, line C1-C2, and line D1-D2 of FIG. 19.

As shown in FIG. 19, the element region R1 and the terminal region R2 are provided in the semiconductor device 5 according to the embodiment. The element region R1 includes the region R1a and the region R1b; and the terminal region R2 includes the region R2a and the region R2b. The region R1a and R1b of the element region R1 and the regions R2a and R2b of the terminal region R2 are arranged in order along the X-direction to be adjacent to each other.

Figure 20:
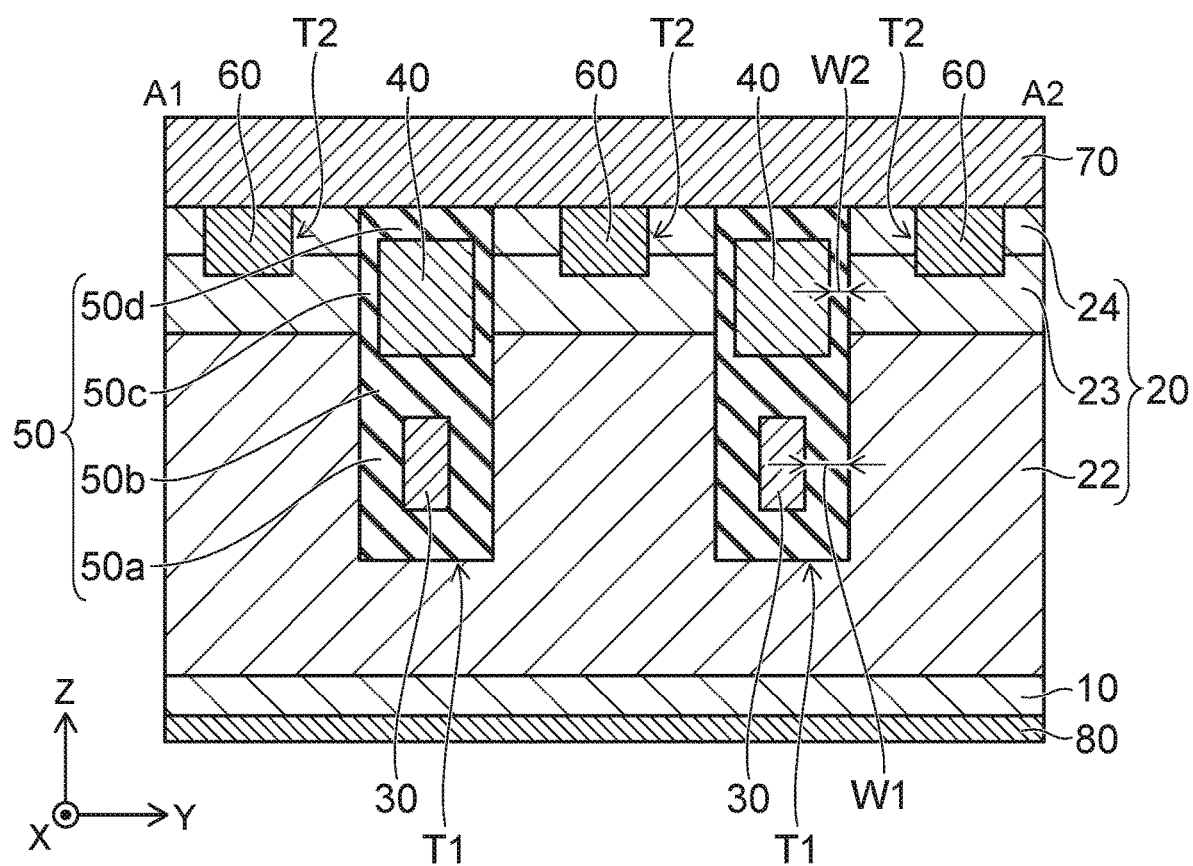
FIG. 20 is a cross-sectional view along line A1-A2 of FIG. 19.

As shown in FIG. 20, the semiconductor device 5 includes the substrate 10, the semiconductor layer 20, the field plate electrode 30, the gate electrode 40, the insulating film 50, the contact 60, the source electrode 70, and the drain electrode 80 in the region R1a of the element region R1.

For the insulating film 50, the thickness W1 of the field plate insulating film 50a is thicker than the thickness W2 of the gate insulating film 50c.

Figure 21:
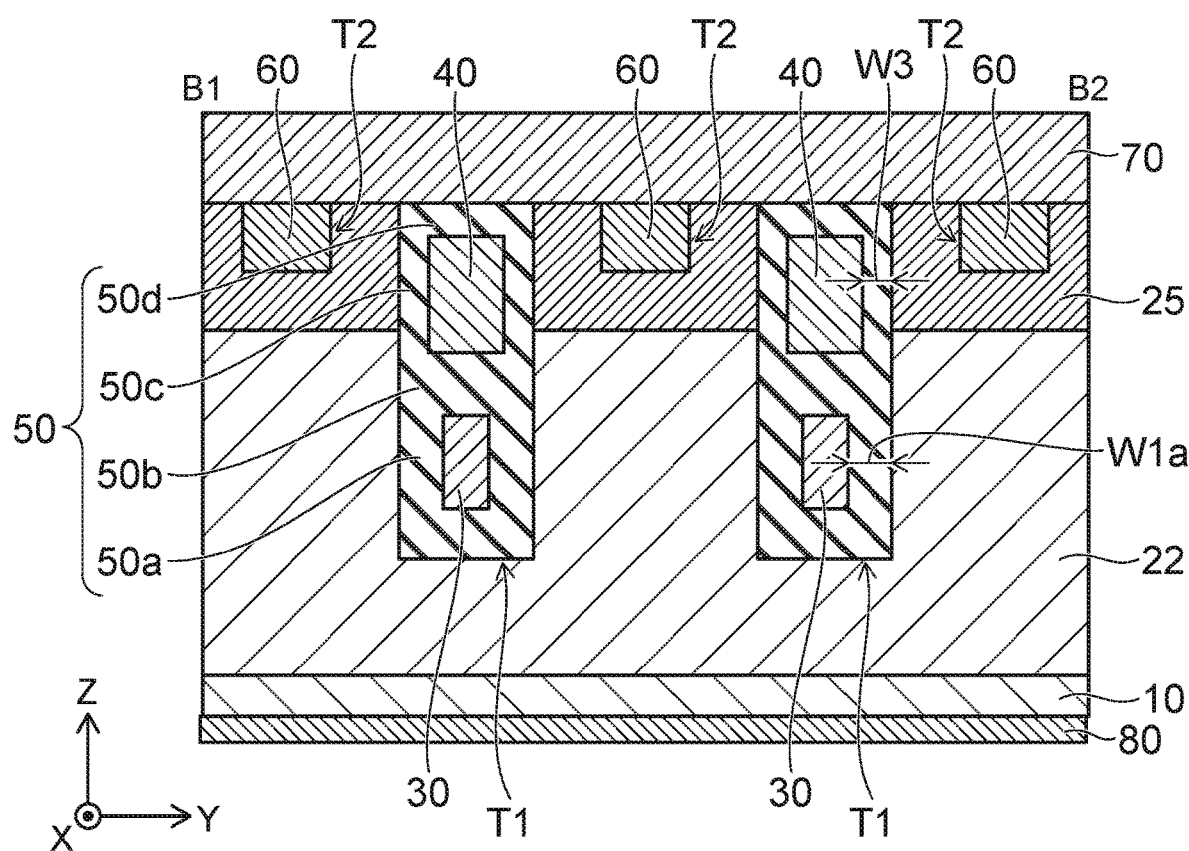
FIG. 21 is a cross-sectional view along line B1-B2 of FIG. 19.

As shown in FIG. 21, the semiconductor device 5 includes the substrate 10, the drift layer 22, the guard ring layer 25, the field plate electrode 30, the gate electrode 40, the insulating film 50, the contact 60, the source electrode 70, and the drain electrode 80 in the region R1b of the element region R1.

For the insulating film 50, the thickness W1a of the field plate insulating film 50a is thicker than the thickness W3 of the gate insulating film 50c.

The thickness W1a of the field plate insulating film 50a in the region R1b of the element region R1 is substantially the same as the thickness W1 of the field plate insulating film 50a in the region R1a of the element region R1. The thickness W3 of the gate insulating film 50c in the region R1b of the element region R1 is thicker than the thickness W2 of the gate insulating film 50c in the region R1a of the element region R1.

Figure 22:
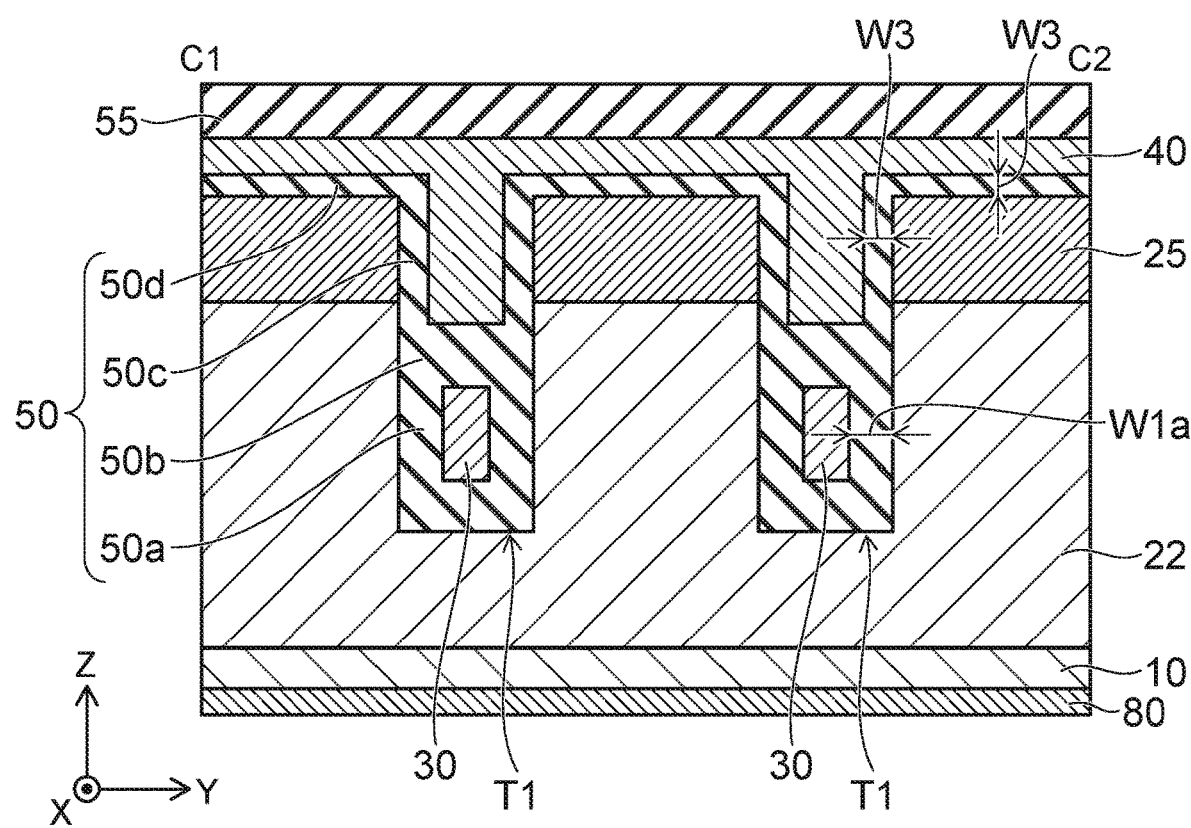
FIG. 22 is a cross-sectional view along line C1-C2 of FIG. 19.

As shown in FIG. 22, the semiconductor device 5 includes the substrate 10, the drift layer 22, the guard ring layer 25, the field plate electrode 30, the gate electrode 40, the insulating film 50, the inter-layer insulating film 55, and the drain electrode 80 in the region R2a of the terminal region R2.

The thickness of the field plate insulating film 50a in the region R2a of the terminal region R2 is substantially the same as the thickness W1a of the field plate insulating film 50a in the region R1b of the element region R1. The thickness of the gate insulating film 50c in the region R2a of the terminal region R2 is substantially the same as the thickness W3 of the gate insulating film 50c in the region R1b of the element region R1.

The thickness in a Z-direction of the inter-layer insulating film 50d is substantially the same as the thickness W3.

Figure 23:
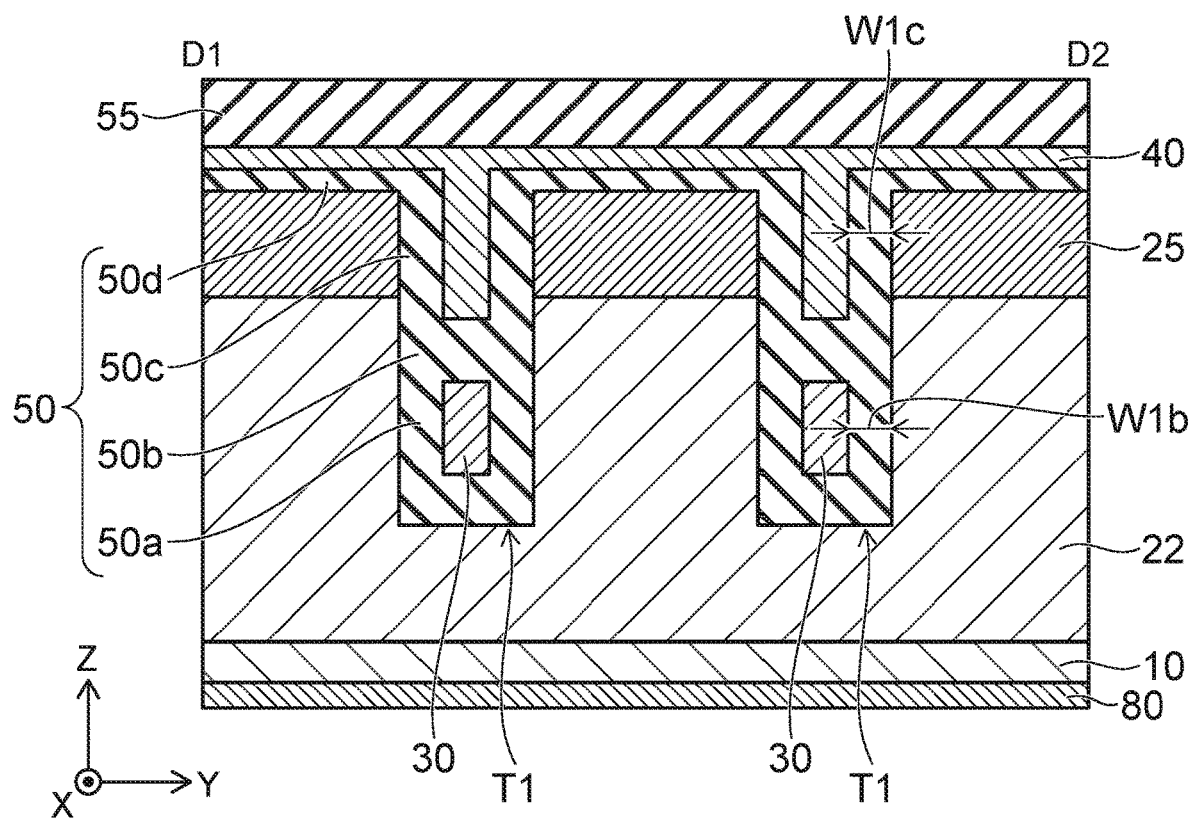
FIG. 23 is a cross-sectional view along line D1-D2 of FIG. 19.

As shown in FIG. 23, the semiconductor device 5 includes the substrate 10, the drift layer 22, the guard ring layer 25, the field plate electrode 30, the gate electrode 40, the insulating film 50, the inter-layer insulating film 55, and the drain electrode 80 in the region R2b of the terminal region R2.

The thickness W1b of the field plate insulating film 50a is substantially the same as the thickness W1c of the gate insulating film 50c.

The thickness W1b of the field plate insulating film 50a in the region R2b of the terminal region R2 is substantially the same as the thickness W1 of the field plate insulating film 50a in the region R1a of the element region R1. The thickness W1c of the gate insulating film 50c in the region R2b of the terminal region R2 is thicker than the thickness W3 of the gate insulating film 50c in the region R1b of the element region R1.

Thus, in the element region R1 and the terminal region R2, the thicknesses W1, W1a, and W1b of the field plate insulating film 50a and the thicknesses W2, W3, and W1c of the gate insulating film 50c satisfy the relational expression (1) described above.

In the embodiment as shown in FIG. 19 and FIG. 22, the gate electrode 40 is formed at the contact 61 vicinity inside the terminal region R2 by patterning a conductive film; and the inter-layer insulating film 50d that has the thickness W3 that is thicker than the thickness W2 is formed between the gate electrode 40 and the guard ring layer 25. Thereby, the electric field concentration at the corner vicinity of the trench T1 can be relaxed; therefore, the decrease of the breakdown voltage of the insulating film 50 at the corner vicinity of the trench T1 can be suppressed.

Otherwise, the effects of the embodiment are similar to those of the first embodiment described above.

Sixth Embodiment

Figure 24:
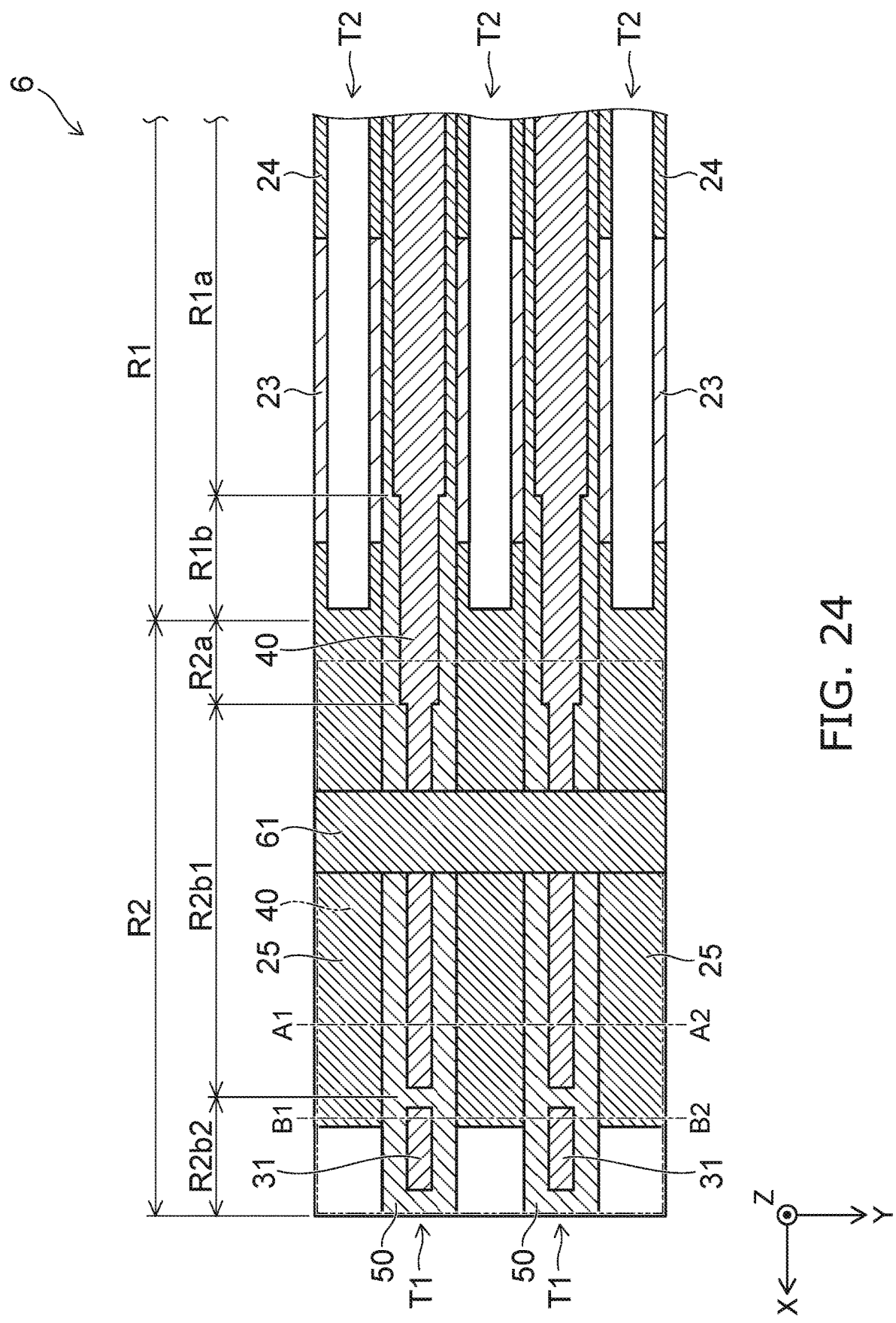
FIG. 24 is a plan view showing a semiconductor device according to a sixth embodiment.
Figure 25:
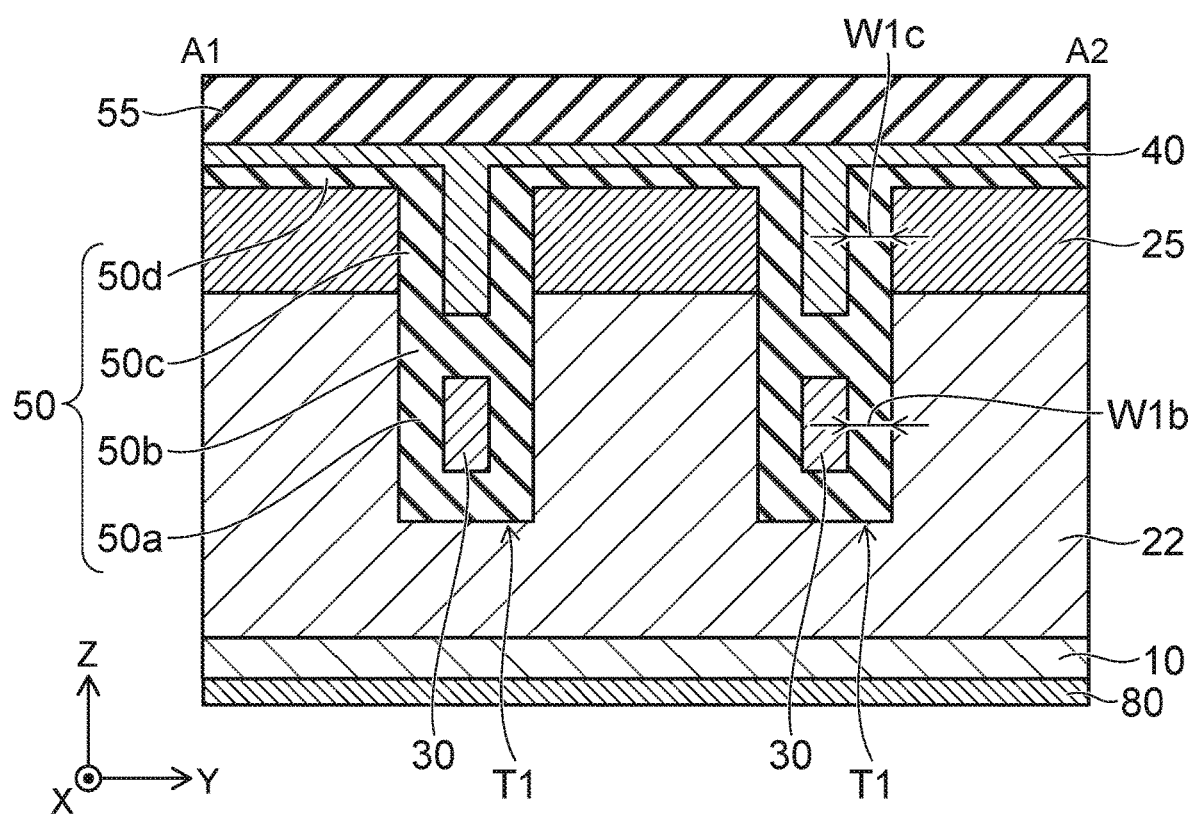
FIG. 25 is a cross-sectional view along line A1-A2 of FIG. 24.
Figure 26:
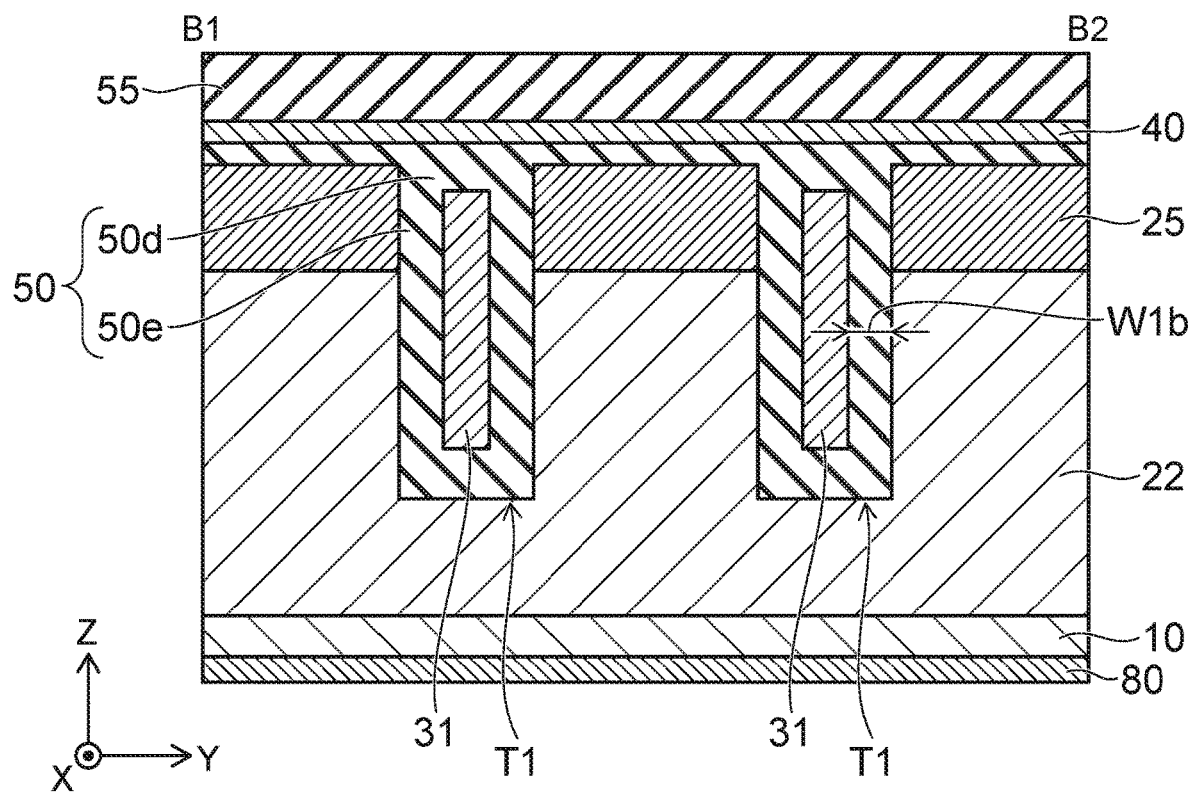
FIG. 26 is a cross-sectional view along line B1-B2 of FIG. 24.

FIG. 24 is a plan view showing a semiconductor device according to the embodiment. FIG. 25 and FIG. 26 are cross-sectional views along line A1-A2 and line B1-B2 of FIG. 24.

As shown in FIG. 24, the element region R1 and the terminal region R2 are provided in the semiconductor device 6 according to the embodiment. The element region R1 includes the region R1a and the region R1b; and the terminal region R2 includes the region R2a, the region R2b1, and the region R2b2. The region R1a and R1b of the element region R1 and the regions R2a, R2b1, and R2b2 of the terminal region R2 are arranged in order along the X-direction to be adjacent to each other.

In the embodiment, the configuration of the element region R1 and the configuration of the region R2a of the terminal region R2 are the same as those of the fifth embodiment. A detailed description of these configurations is therefore omitted.

In the region R2b1 of the terminal region R2 as shown in FIG. 25, the thickness W1b of the field plate insulating film 50a is substantially the same as the thickness W1c of the gate insulating film 50c. For the gate insulating film 50c, the thickness W1c is thicker than the thickness W3. The thickness W3 is the thickness of the gate insulating film 50c in the region R1b of the element region R1.

As shown in FIG. 26, the thickness of the field plate insulating film 50e in the region R2b2 of the terminal region R2 is substantially the same as the thickness W1b of the field plate insulating film 50a in the region R2b1 of the terminal region R2.

Thus, in the element region R1 and the terminal region R2, the thicknesses W1, W1a, and W1b of the field plate insulating film 50a and the thicknesses W2, W3, and W1c of the gate insulating film 50c satisfy the relational expression (1) described above.

In the embodiment, the gate-drain capacitance (Cgd) can be reduced because the field plate electrode 31 is formed in the region R2b1 of the terminal region R2 which has the drain potential.

Otherwise, the effects of the embodiment are similar to those of the fifth embodiment described above.

Seventh Embodiment

Figure 27:
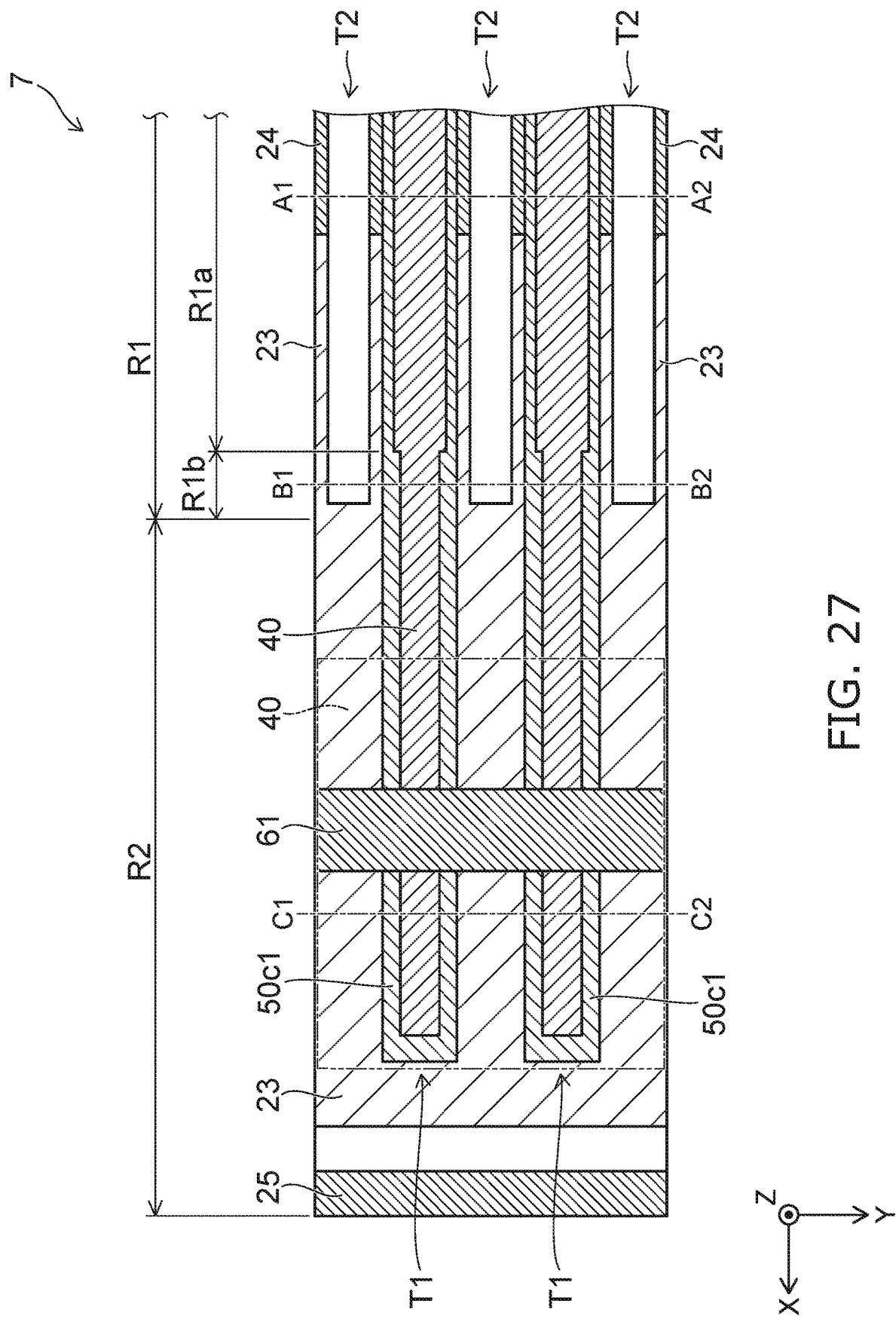
FIG. 27 is a plan view showing a semiconductor device according to a seventh embodiment.
Figure 28:
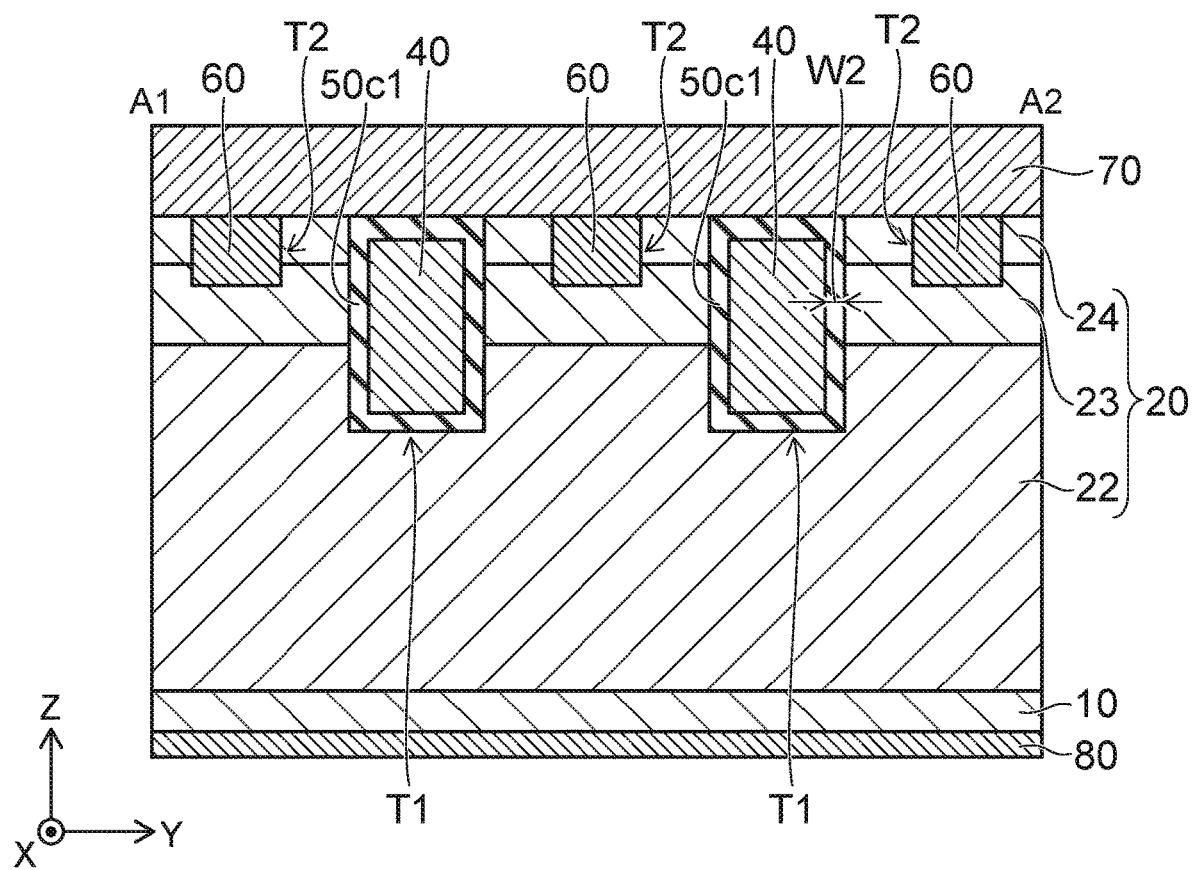
FIG. 28 is a cross-sectional view along line A1-A2 of FIG. 27.
Figure 29:
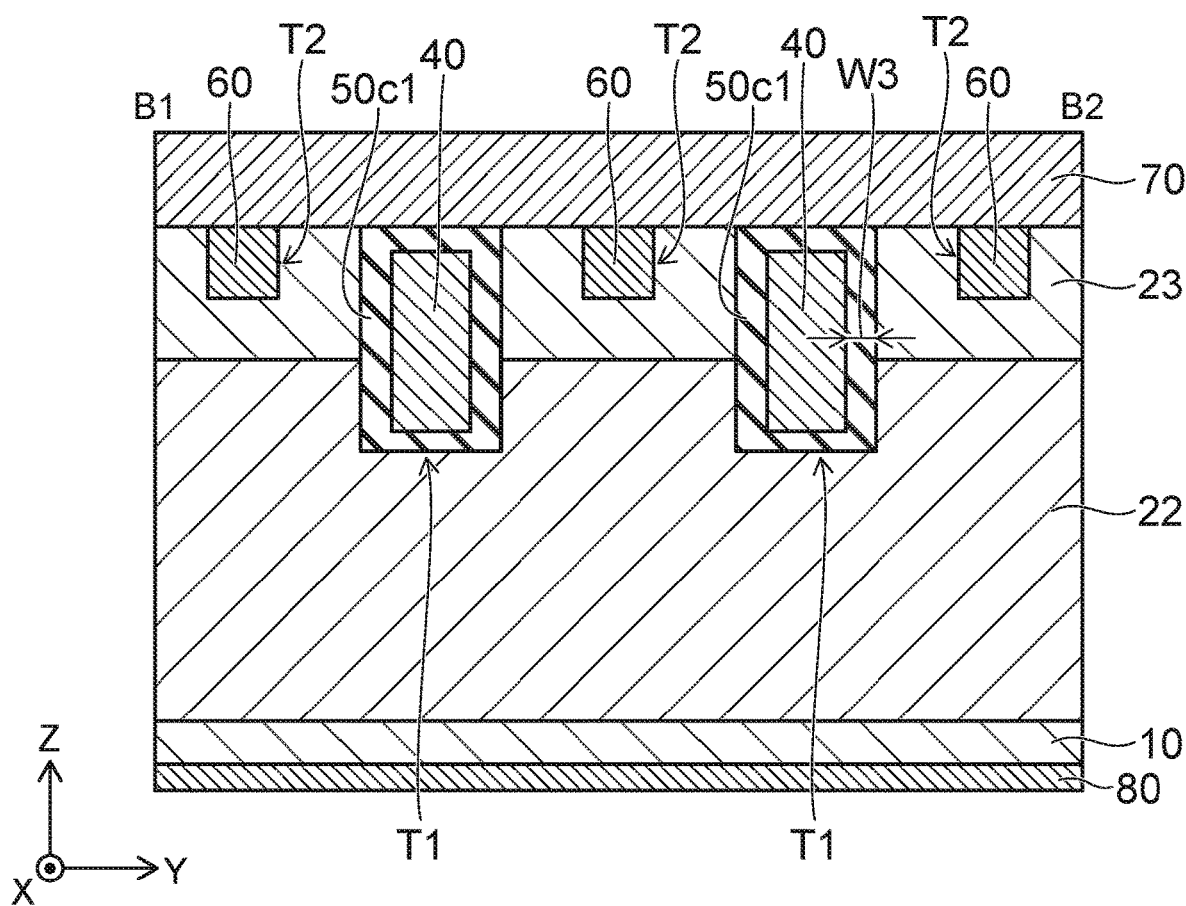
FIG. 29 is a cross-sectional view along line B1-B2 of FIG. 27.
Figure 30:
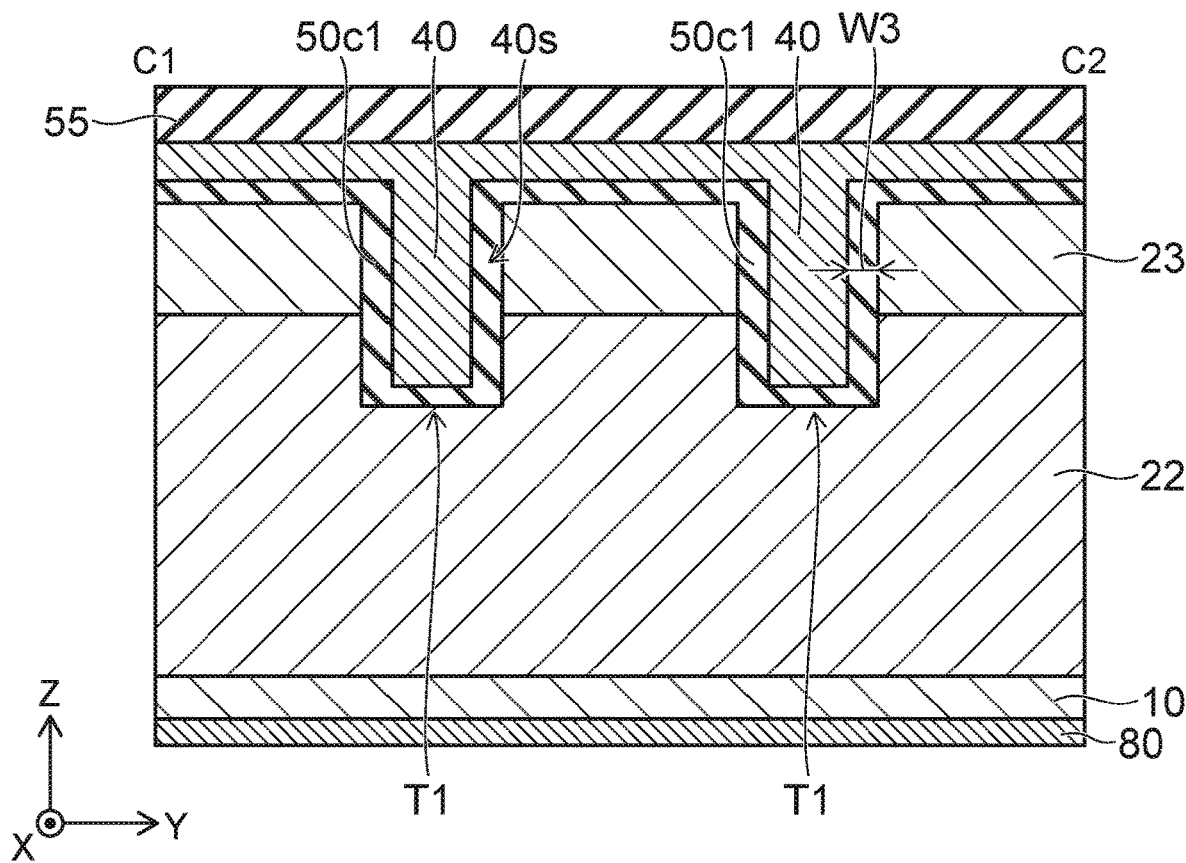
FIG. 30 is a cross-sectional view along line C1-C2 of FIG. 27.

FIG. 27 is a plan view showing a semiconductor device according to the embodiment. FIG. 28, FIG. 29, and FIG. 30 are cross-sectional views along line A1-A2, line B1-B2, and line C1-C2 of FIG. 27.

As shown in FIG. 27, the element region R1 and the terminal region R2 are provided in the semiconductor device 7 according to the embodiment. The element region R1 includes the region R1a and the region R1b. The terminal region R2 and the region R1a and R1b of the element region R1 are arranged in order along the X-direction to be adjacent to each other.

As shown in FIG. 28, the semiconductor device 7 includes the substrate 10, the semiconductor layer 20, the gate electrode 40, a gate insulating film 50c1, the contact 60, the source electrode 70, and the drain electrode 80 in the region R1a of the element region R1. The semiconductor layer 20 includes the drift layer 22, the base layer 23, and the source layer 24.

The multiple trenches T1 that are arranged along the Y-direction are formed inside the semiconductor layer 20; and the gate electrode 40 is disposed inside each of the trenches T1. That is, the semiconductor device 7 of the embodiment is a MOSFET having a trench gate structure.

In the region R1a of the element region R1, a gate insulating film 50c1 has the thickness W2.

As shown in FIG. 29, the semiconductor device 7 includes the substrate 10, the drift layer 22, the base layer 23, the gate electrode 40, the gate insulating film 50c1, the contact 60, the source electrode 70, and the drain electrode 80 in the region R1b of the element region R1.

In the region R1b of the element region R1, the gate insulating film 50c1 has the thickness W3. The thickness W3 is thicker than the thickness W2.

As shown in FIG. 30, the semiconductor device 7 includes the substrate 10, the drift layer 22, the base layer 23, the gate electrode 40, the gate insulating film 50c1, the inter-layer insulating film 55, and the drain electrode 80 in the terminal region R2.

The thickness of the gate insulating film 50c1 in the terminal region R2 is substantially the same as the thickness W3 of the gate insulating film 50c1 in the region R1b of the element region R1.

In the embodiment, the gate insulating film 50c1 is provided so that the thicknesses W2 and W3 increase in stages through the terminal region R2 from the element region R1. That is, in the terminal region R2 and the region R1b of the element region R1, the gate insulating film 50c1 is provided to have the thickness W3 that is thicker than the thickness W2.

Although the thickness of the gate insulating film 50c1 is changed to have thicknesses having two stages such as the thicknesses W2 and W3 through the terminal region R2 from the element region R1, it is sufficient to increase in stages through the terminal region R2 from the element region R1. For example, the thickness of the gate insulating film 50c1 may be changed to have thicknesses having three or more stages through the terminal region R2 from the element region R1.

Otherwise, the effects of the embodiment are similar to those of the first embodiment described above.

As described above, although the case is described as an example where the semiconductor devices according to the embodiments are vertical power MOSFETs, the semiconductor devices according to the embodiments are not limited to vertical power MOSFETs. For example, the semiconductor devices according to the embodiments may be vertical IGBTs or lateral power MOSFETs. Also, the polarity may be the n-channel type or the p-channel type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor layer having a lower surface and an upper surface opposing to the lower surface, a trench being formed in the semiconductor layer from the upper surface;
   a first electrode provided in the trench, extending in a first direction, the first direction being parallel to the lower surface, the first direction being perpendicular to a second direction, the second direction being from the lower surface toward the upper surface;
   a second electrode provided under the first electrode in the trench, and extending in the first direction, the first electrode and the second electrode being arranged in the second direction in the trench; and
   an insulating film provided in the trench, the insulating film being disposed between the semiconductor layer and the first electrode, between the semiconductor layer and the second electrode, and between the first electrode and the second electrode,
   a thickness of the insulating film between the first electrode and the semiconductor layer in a third direction increasing in stages along the first direction, the third direction being perpendicular to the first direction and the second direction,
   the insulating film having a first thickness between the first electrode and the semiconductor layer in a first region of the semiconductor device,
   the insulating film having a second thickness between the first electrode and the semiconductor layer in a second region of the semiconductor device, the first region surrounding the second region,
   the insulating film having a third thickness between the first electrode and the semiconductor layer in a third region of the semiconductor device, the third region being located between the first region and the second region, the third thickness being thinner than the first thickness and thicker than the second thickness, and
   the insulating film having a fourth thickness between the second electrode and the semiconductor layer in the first region, the first thickness being substantially the same as the fourth thickness.

2. The device according to claim 1, wherein the insulating film has the fourth thickness between the second electrode and the semiconductor layer in the second region.

3. The device according to claim 1, wherein the insulating film contacts the semiconductor layer, the first electrode and the second electrode.

4. The device according to claim 1, wherein the semiconductor layer includes:
   a first semiconductor layer of a first conductivity type,
   a second semiconductor layer of a second conductivity type provided on the first semiconductor layer,
   a third semiconductor layer of the first conductivity type provided on the second semiconductor layer in the second region, and
   a fourth semiconductor layer of the second conductivity type provided on the first semiconductor layer in the first region.

5. The device according to claim 4, further comprising:
   a third electrode connected to the first semiconductor layer; and
   a fourth electrode connected to the third semiconductor layer,
   wherein the third electrode and the fourth electrode are arranged in the second direction.

6. A semiconductor device, comprising:
   a semiconductor substrate of a first conductivity type;
   a first semiconductor layer provided on the semiconductor substrate, the first semiconductor layer being of the first conductivity type;
   a second semiconductor layer provided selectively on the first semiconductor layer, the second semiconductor layer being of a second conductivity type;
   a third semiconductor layer provided selectively on the second semiconductor layer, the third semiconductor layer being of the first conductivity type;
   a first electrode provided inside a trench reaching the first semiconductor layer through the third semiconductor layer and the second semiconductor layer, the first electrode being provided at the first semiconductor layer, the second semiconductor layer, and the third semiconductor layer;
   a gate insulating film provided between the first electrode and an inner surface of the trench;

a second electrode provided in the first semiconductor layer, the second electrode being provided inside the trench and positioned lower than the first electrode;

a field plate insulating film provided between the second electrode and the inner surface of the trench;

a third electrode provided on a lower surface of the semiconductor substrate and connecting the semiconductor substrate; and a fourth electrode provided on the third semiconductor layer and connecting the third semiconductor layer, the gate insulating film becoming thicker in stages to have three or more mutually-different thicknesses from an element region through a terminal region on the semiconductor substrate, the terminal region surrounding the element region, and the element region including at least the third semiconductor layer, and a thickness of the field plate insulating film provided between the second electrode and the inner surface of the trench in the terminal region being substantially the same as a thickness of the gate insulating film provided between the first electrode and the inner surface of the trench in the terminal region.

7. The device according to claim 6, wherein the gate insulating film has a first thickness and a second thickness in the element region, the second thickness is thicker than the first thickness, the gate insulating film has a third thickness in the terminal region, the third thickness is thicker than the second thickness, and the field plate insulating film has a fourth thickness in the terminal region, the fourth thickness is substantially the same as the third thickness.

8. The device according to claim 6, wherein the three or more mutually-different thicknesses from the element region through the terminal region are mutually different along a first direction perpendicular to a second direction, the second direction being from the substrate to the fourth electrode.

9. The device according to claim 6, wherein the gate insulating film has a first thickness in the element region, the gate insulating film has a second thickness and a third thickness in the terminal region, the second thickness is thicker than the first thickness, the third thickness is thicker than the second thickness, and the field plate insulating film has a fourth thickness in the terminal region, the fourth thickness is substantially the same as the third thickness.

10. The device according to claim 9, wherein the gate insulating film has a first thickness in the terminal region.

11. The device according to claim 9, wherein the second thickness is not less than 1.3 times the first thickness.

* * * * *